United States Patent
Pajerski

(10) Patent No.: US 10,475,227 B1
(45) Date of Patent: Nov. 12, 2019

(54) SYSTEMS AND METHODS FOR THREE DIMENSIONAL COMPUTATION AND VISUALIZATION USING A PARALLEL PROCESSING ARCHITECTURE

(71) Applicant: Ansys, Inc., Canonsburg, PA (US)

(72) Inventor: Vince M. Pajerski, Canonsburg, PA (US)

(73) Assignee: Ansys, Inc., Canonsburg, PA (US)

( * ) Notice: Subject to any disclaimer, the term of this patent is extended or adjusted under 35 U.S.C. 154(b) by 533 days.

(21) Appl. No.: 14/627,549

(22) Filed: Feb. 20, 2015

Related U.S. Application Data

(60) Provisional application No. 61/946,088, filed on Feb. 28, 2014.

(51) Int. Cl.
| | | |
|---|---|---|
| G06T 15/08 | (2011.01) | |
| G06T 15/00 | (2011.01) | |
| G06T 15/80 | (2011.01) | |
| G06F 17/50 | (2006.01) | |

(52) U.S. Cl.
CPC ........ G06T 15/005 (2013.01); G06F 17/5018 (2013.01); G06T 15/08 (2013.01); G06T 15/80 (2013.01); G06T 2210/52 (2013.01)

(58) Field of Classification Search
None
See application file for complete search history.

(56) References Cited

U.S. PATENT DOCUMENTS

| | | | | |
|---|---|---|---|---|
| 4,984,157 A | * | 1/1991 | Cline | G06T 15/08 345/424 |
| 5,630,034 A | * | 5/1997 | Oikawa | G06T 15/08 345/424 |
| 6,424,346 B1 | * | 7/2002 | Correll | G06T 15/005 345/424 |
| 8,340,381 B2 | * | 12/2012 | Franaszek | G06K 9/34 382/128 |
| 2003/0103551 A1 | * | 6/2003 | Haddad | E21B 47/065 374/136 |
| 2006/0181551 A1 | * | 8/2006 | Matsumoto | G06T 15/08 345/679 |
| 2006/0248571 A1 | * | 11/2006 | Ruge | G06F 3/14 725/135 |
| 2006/0274065 A1 | * | 12/2006 | Buyanovskiy | G06T 15/06 345/424 |
| 2007/0103464 A1 | * | 5/2007 | Kaufman | G06T 7/0012 345/424 |
| 2008/0232694 A1 | * | 9/2008 | Sulatycke | G06T 15/08 382/224 |

(Continued)

FOREIGN PATENT DOCUMENTS

JP 10019919 A * 1/1998

*Primary Examiner* — Xiao M Wu
*Assistant Examiner* — Steven Z Elbinger
(74) *Attorney, Agent, or Firm* — Jones Day

(57) ABSTRACT

Systems and methods are provided for system for generating a physical model for engineering design or visualization. A system includes a processor-readable memory that further includes one or more data structures containing physical data associated with points in a three dimensional volume. A system also includes a plurality of data processors that operate in parallel to perform calculations using the physical data to generate a physical model for providing real-time visualization and calculation associated with the three dimensional volume.

46 Claims, 23 Drawing Sheets

(56) References Cited

U.S. PATENT DOCUMENTS

| | | | |
|---|---|---|---|
| 2009/0096807 A1* | 4/2009 | Silverstein | G06T 11/001 345/593 |
| 2009/0243916 A1* | 10/2009 | Beeri | G01S 7/062 342/179 |
| 2010/0039434 A1* | 2/2010 | Makkinejad | G06T 13/80 345/473 |
| 2011/0150421 A1* | 6/2011 | Sasaki | G11B 27/3027 386/241 |
| 2012/0037379 A1* | 2/2012 | Hilliard | G06T 17/05 166/369 |
| 2012/0232388 A1* | 9/2012 | Curra | A61B 8/466 600/438 |
| 2012/0296609 A1* | 11/2012 | Khan | G06T 19/00 703/1 |
| 2013/0112407 A1* | 5/2013 | Cheng | G01V 11/00 166/250.15 |
| 2013/0187930 A1* | 7/2013 | Millman | G06T 13/20 345/473 |
| 2013/0238511 A1* | 9/2013 | Van Der Veen | G06Q 10/04 705/306 |
| 2013/0335417 A1* | 12/2013 | McQueston | A61B 6/145 345/424 |
| 2015/0042657 A1* | 2/2015 | Smith-Casem | G06T 13/20 345/427 |
| 2015/0112969 A1* | 4/2015 | Prabhu | G06Q 10/06 707/722 |
| 2016/0006951 A1* | 1/2016 | Moghadam | G03B 35/02 348/164 |

* cited by examiner

SYSTEMS AND METHODS FOR THREE DIMENSIONAL COMPUTATION AND VISUALIZATION USING A PARALLEL PROCESSING ARCHITECTURE

CROSS REFERENCE TO RELATED APPLICATIONS

This application claims priority to U.S. Patent Application No. 61/946,088, entitled "Systems and Methods for Three Dimensional Computation and Visualization Using a Parallel Processing Architecture," filed Feb. 28, 2014, the entirety of which is herein incorporated by reference.

FIELD

This disclosure is related generally to engineering simulation and more particularly to three dimensional computation and simulation for engineering design and visualization.

BACKGROUND

Three dimensional graphical rendering can be a resource intensive process. The human eye is capable of discerning frame transitions that are more than 30 milliseconds apart from one another. Thus, providing a system for real-time manipulation of a three dimensionally rendered object, where the screen must be refreshed at least once every 30 milliseconds quickly moves beyond the capabilities of existing hardware/software configurations as the complexity of the object being displayed increases. Certain applications, such as engineering design and simulation applications, require visualization and computation associated with highly complex objects.

SUMMARY

Systems and methods are provided for system for generating a physical model for engineering design or visualization. A system includes a processor-readable memory that further includes one or more data structures containing physical data associated with points in a three dimensional volume. A system also includes a plurality of data processors that operate in parallel to perform calculations using the physical data to generate a physical model for providing real-time visualization and calculation associated with the three dimensional volume.

As another example, a method of generating a physical model for engineering design or visualization includes generating a density structure for storing density data in a processor-readable memory, the density data identifying densities at points in a three dimensional volume. A results data structure is generated for storing results data in the processor-readable memory, the results data identifying physical values at the points in the three dimensional volume. Calculations are performed using the density data and the results data to generate a physical model for visualization utilizing a plurality of data processors operating in parallel.

As a further example, a system for generating a physics simulation model for engineering design or visualization includes a finite element data structure for storing at least density data and results data. A volumetric data structure stores volumetric data, where the volumetric data is based on at least the density data and the results data. A plurality of data processors operate in parallel to perform calculations using the volumetric data to generate a discretized physics model based on visualization algorithms and physics computational algorithms.

DETAILED DESCRIPTION

Figure 1:
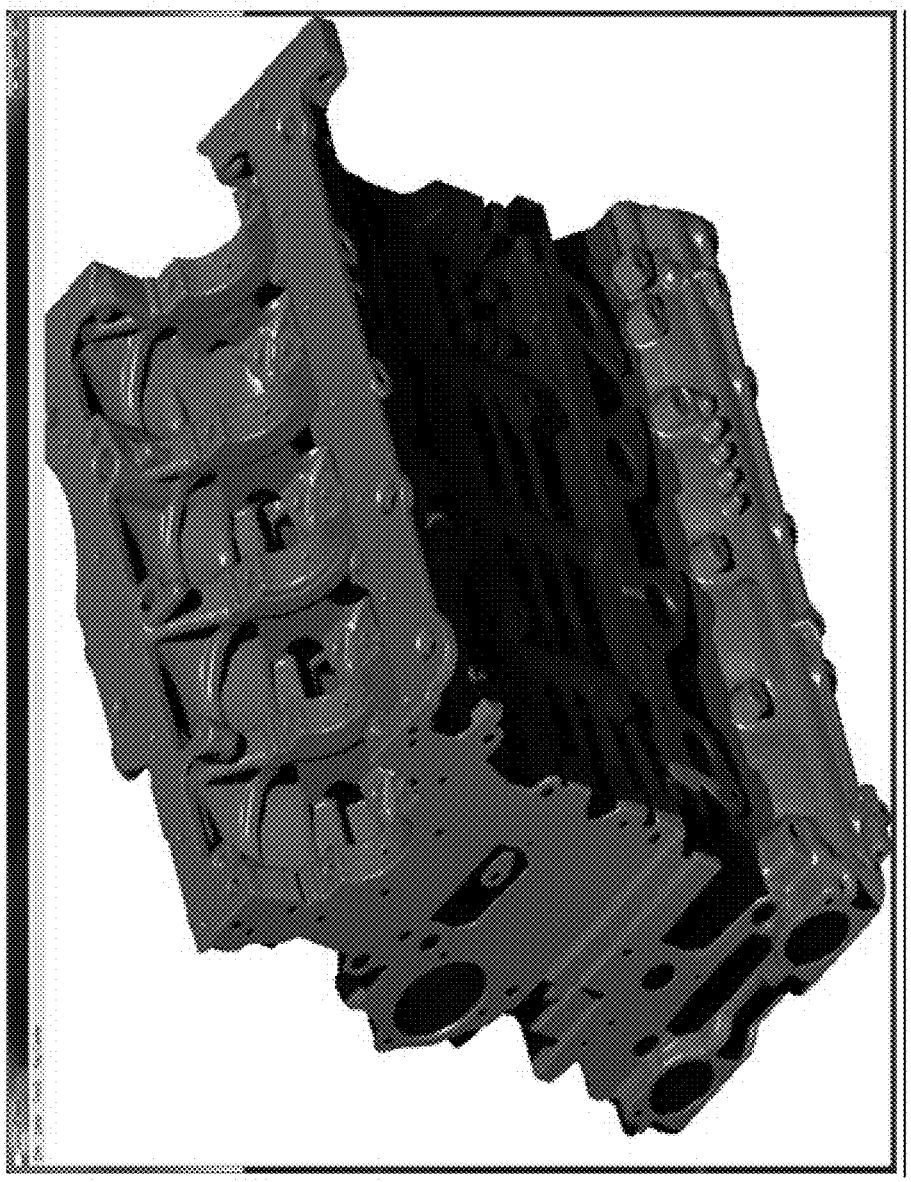
FIG. 1 depicts a two dimensional visualization of points of a three dimensional volume generated by a system for generating a physical model for engineering design or visualization.

FIG. 1 depicts a two dimensional visualization of points of a three dimensional volume generated by a system for generating a physical model for engineering design or visualization. In the example of FIG. 1, a portion of a complex object is depicted within a window on a computer-implemented display device. In one embodiment, the engine can be rotated, enlarged, or shrunk on demand based on user input, such as a user mouse input, keyboard input, touch screen input, stylus input, or other user control. Based on such input, the system for generating a physical model generates a next frame for display in real time, such that the next frame is generated and displayed less than 30 milliseconds from entry of the user command.

Figure 2:
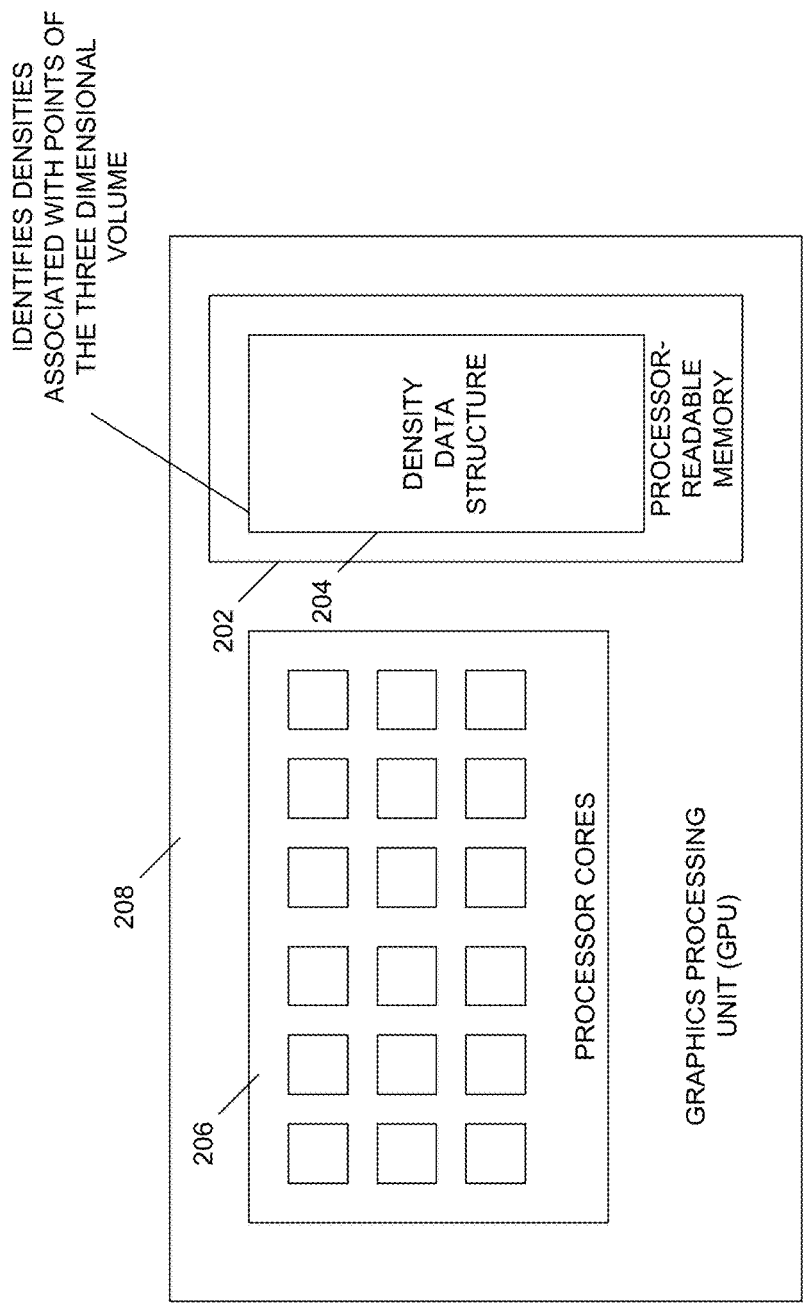
FIG. 2 is a block diagram depicting an example system for generating a physical model for engineering design or visualization.

FIG. 2 is a block diagram depicting an example system for generating a physical model for engineering design or visualization. The system includes a processor-readable memory 202 that includes one or more data structures 204 containing physical data associated with points in a three dimensional volume. The system further includes a plurality of data processors 206 that operate in parallel to perform calculations using the physical data to generate a physical model for providing real time visualization and calculation associated with the three dimensional volume. In the example of FIG. 2, the processor-readable memory 202 and the plurality of data processors 206 are embodied in a graphics processing unit (GPU) 208. The GPU 208 includes an array of processor cores that are configured to execute a number of operations in parallel and are configured for fast access to data stored in the processor-readable memory 202. In one example, the system is programmed using an OpenGL Shader Language (GLSL), were individual stages in the processors' pipelines can be overridden as needed to provide the desired physical model and visualization. In other examples or portions of examples, other languages such as CUDA and OpenCL can be utilized.

In the example, of FIG. 2, the processor-readable memory 202 includes a density data structure 204. The density data structure stores density data that identifies densities at points within a three dimensional volume. Density data in a density data structure can take a variety of forms. In one example, the density data structure is a three dimensional array that includes a density value in each position within the array within a range of 0-a (e.g., a=1), where each position in the three dimensional array corresponds to a point in the three dimensional volume.

Figure 3:
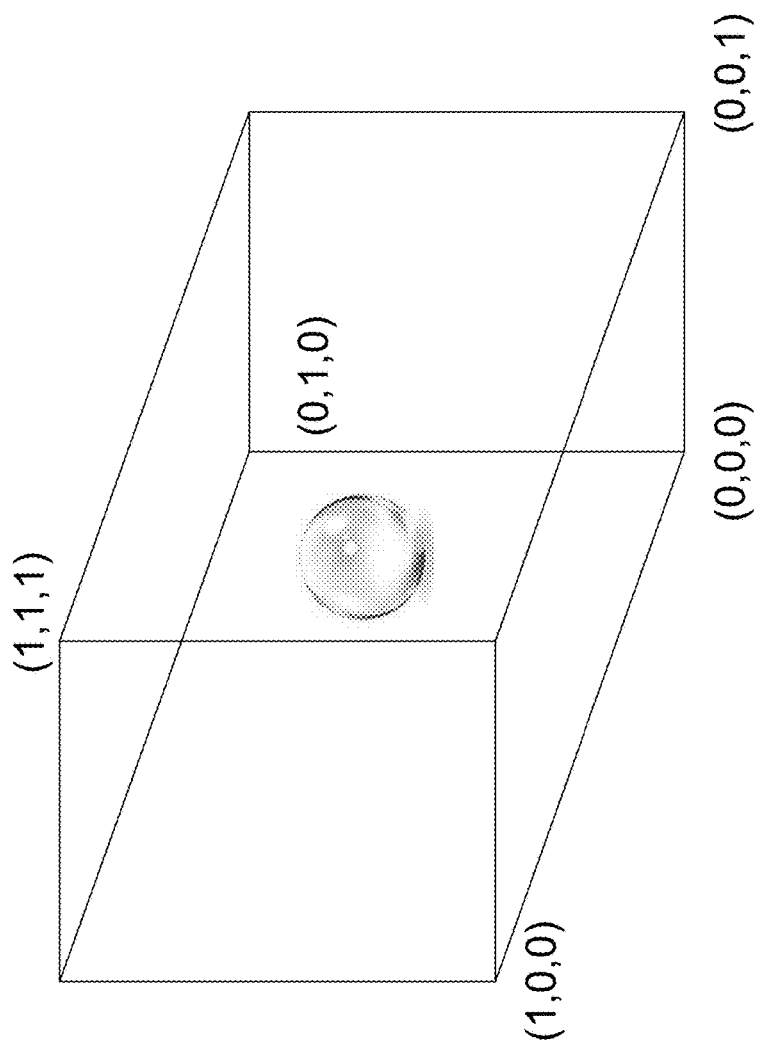
FIG. 3 is a diagram depicting an example three dimensional volume containing a sphere.

FIG. 3 is a diagram depicting an example three dimensional volume containing a sphere. The three dimensional volume is defined using a Cartesian coordinate system which ranges from 0 to 1 in each of an x, y, and z direction. A density data structure is loaded with data (e.g., data from an external data store) that identifies densities at points within the three dimensional volume. Points in the three dimensional volume that are wholly within the sphere may have maximum density values (e.g., density=1), while points in the three dimensional volume outside of the sphere may have minimum density values (e.g., density=0). Points near the boundary of the sphere may have intermediate density values based on their degree of inclusion within the sphere (e.g., a particular surface point may have density=0.66).

Figure 4:
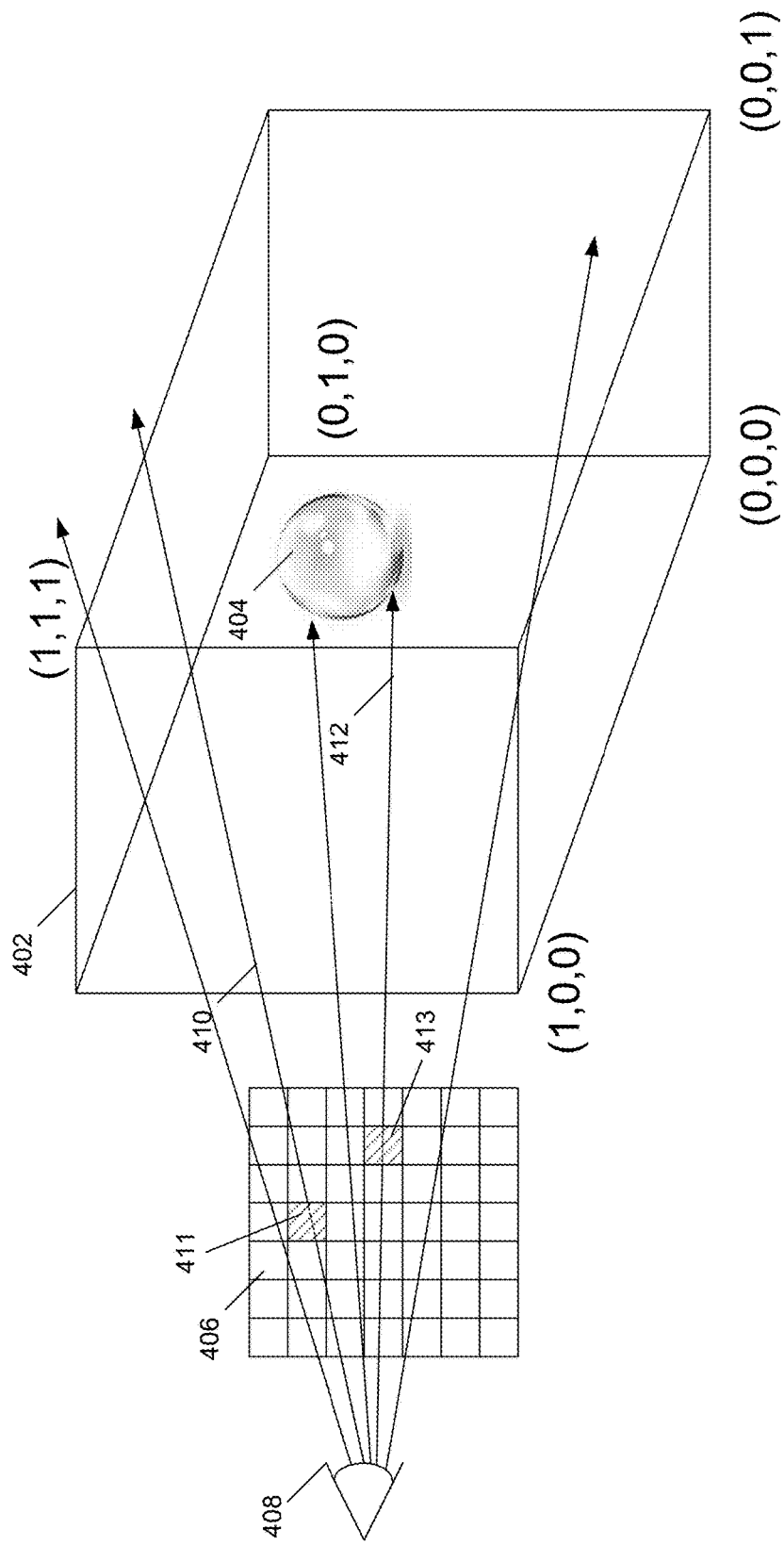
FIG. 4 is a diagram depicting an example process for generating a two dimensional visualization of a three dimensional volume.

FIG. 4 is a diagram depicting an example process for generating a two dimensional visualization of a three dimensional volume. A three dimensional volume 402 is defined on a scale of (0, 0, 0) to (1, 1, 1) in a Cartesian coordinate system. A sphere object 404 is defined within the three dimensional volume using a density data structure that identifies densities at points within the three dimensional volume 402. The plurality of data processors of a system for generating a physical model for engineering design or visualization are configured to generate a two dimensional visualization 406 of the three dimensional volume 402. FIG. 4 depicts the two dimensional visualization at 406 as a two dimensional array of pixel values (e.g., pixel values to be displayed on a screen of a computer device), where the plurality of data processors operate in parallel to determine the pixel values. The pixel values 406 are determined based on a vantage point 408, designated by an eye in FIG. 4.

In operation, the plurality of data processors determine the pixel values 406 individually, where the plurality of data processors can operate in parallel to determine multiple pixel values 406 at the same time. For example, to determine a pixel value for a particular pixel of the display, the plurality of data processors identify points in the three dimensional volume along a ray (e.g., ray 410, ray 412) originating from the vantage point 408, where the ray travels through the particular pixel 411, 413 in the array of pixels 406 and through a portion of the three dimensional volume 402. The pixel value for the particular pixel is determined based on the identified points on the ray, a visualization criterion, and the density data in the density data structure. A pixel value determination is performed for each of the pixels of the display 406.

In one example, the visualization criterion commands visualization of a first identified point in the three dimensional volume 402 along the ray having a corresponding density data value that meets a display density threshold (e.g., density=1, density≥0.6). In one example, the display density threshold is adjustable in real time based on user input. When no point in the three dimensional volume 402 along a ray is found to meet the display density threshold, a background pixel value or a default pixel value is determined and displayed for the particular pixel. For example, in FIG. 4, ray 410 originates from the vantage point 408 and intersects a first particular pixel 411 of the plurality of pixels 406. As ray 410 traverses the three dimensional volume 402, it does not intersect any point in the three dimensional volume that meets the display density threshold. Thus, the first particular pixel 411 is defined a background or default pixel value for display. In contrast, ray 412 originates from the vantage point 408, intersects a second particular pixel 413 of the plurality of pixels 406 and does intersect a point in the three dimensional volume that meets the display density threshold where that ray intersects the sphere 404 defined in the density data structure. Because ray 412 intersects a point in the three dimensional volume that meets the display density threshold, a pixel value that differs from the background or default pixel value is assigned to the second particular pixel 413 of the display 406.

In one example, a common pixel value (e.g., a grayscale value, a color value) is assigned for each pixel of the display 406 having a corresponding ray that intersects a point in the three dimensional volume that meets the display density threshold. In other examples, pixels of the display 406 having rays that intersect points that meet the display density threshold are assigned a pixel value that is based on additional calculation, such as a shading calculation, a physical value calculation, or combinations thereof.

Figure 5:
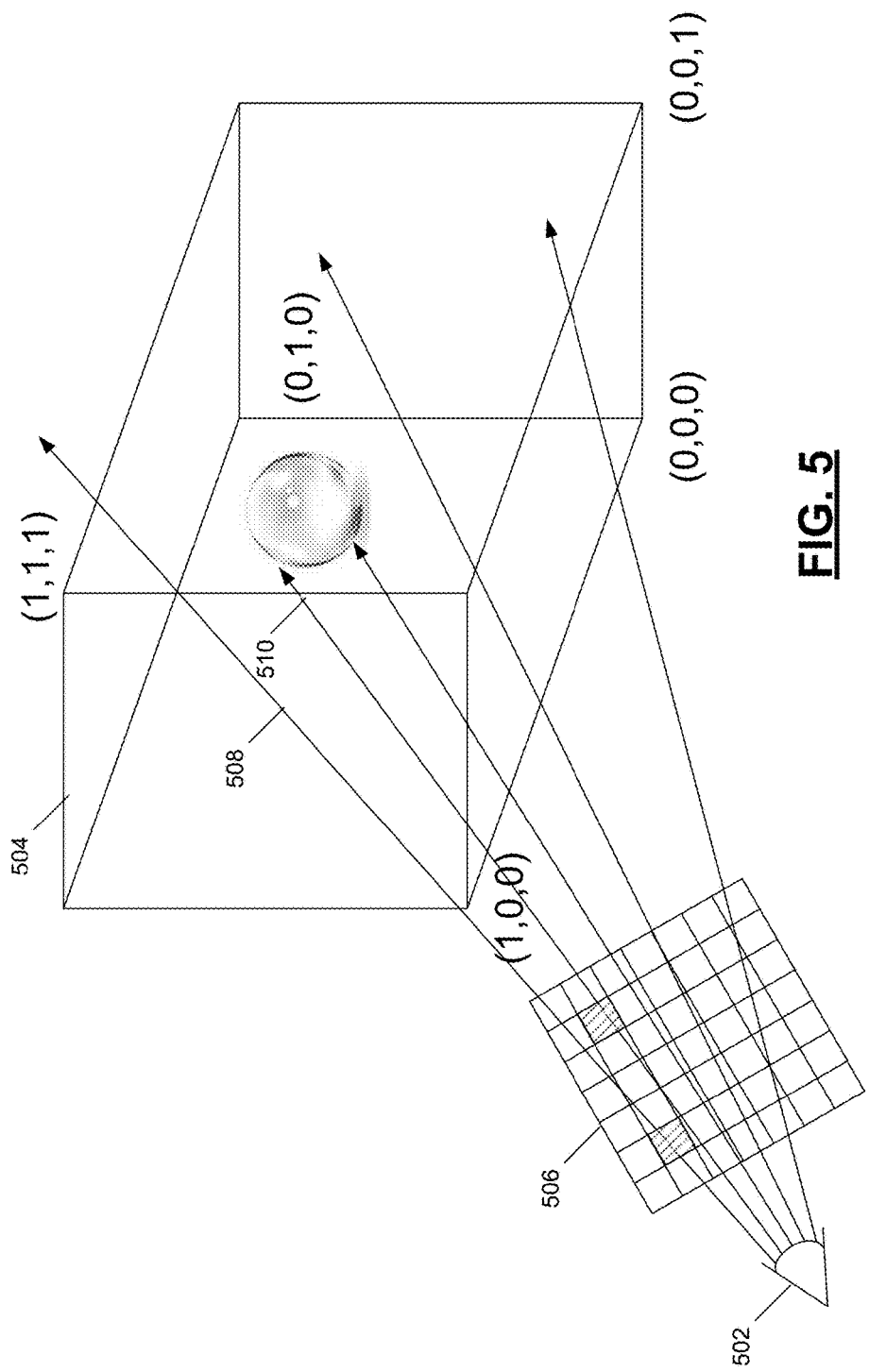
FIG. 5 is a diagram depicting a recalculation of pixel values based on a change in vantage point.

FIG. 5 is a diagram depicting a recalculation of pixel values based on a change in vantage point. In FIG. 5, the vantage point 502 has been adjusted relative to the three dimensional volume 504, such as based on a user control (e.g., a click and drag action). Based on the change in vantage point 502, the pixel values of the display 506 are recalculated, where in some embodiments, the recalculation and redisplay of the pixels is done in real time and less than 30 milliseconds. The plurality of data processors again determine the pixel values 506 individually, where the plurality of data processors can operate in parallel to determine multiple pixel values 506 at the same time. To determine a pixel value for a particular pixel of the display, the plurality of data processors identify points in the three dimensional volume 504 along a ray (e.g., ray 508, ray 510) originating from the vantage point 502, where the ray travels through the particular pixel in the array of pixels 506 and through a portion of the three dimensional volume 504. The pixel value for the particular pixel is determined based on the identified points on the ray, a visualization criterion, and the density data in the density data structure, where a pixel value determination is performed for each of the pixels of the display 506.

Figure 6:
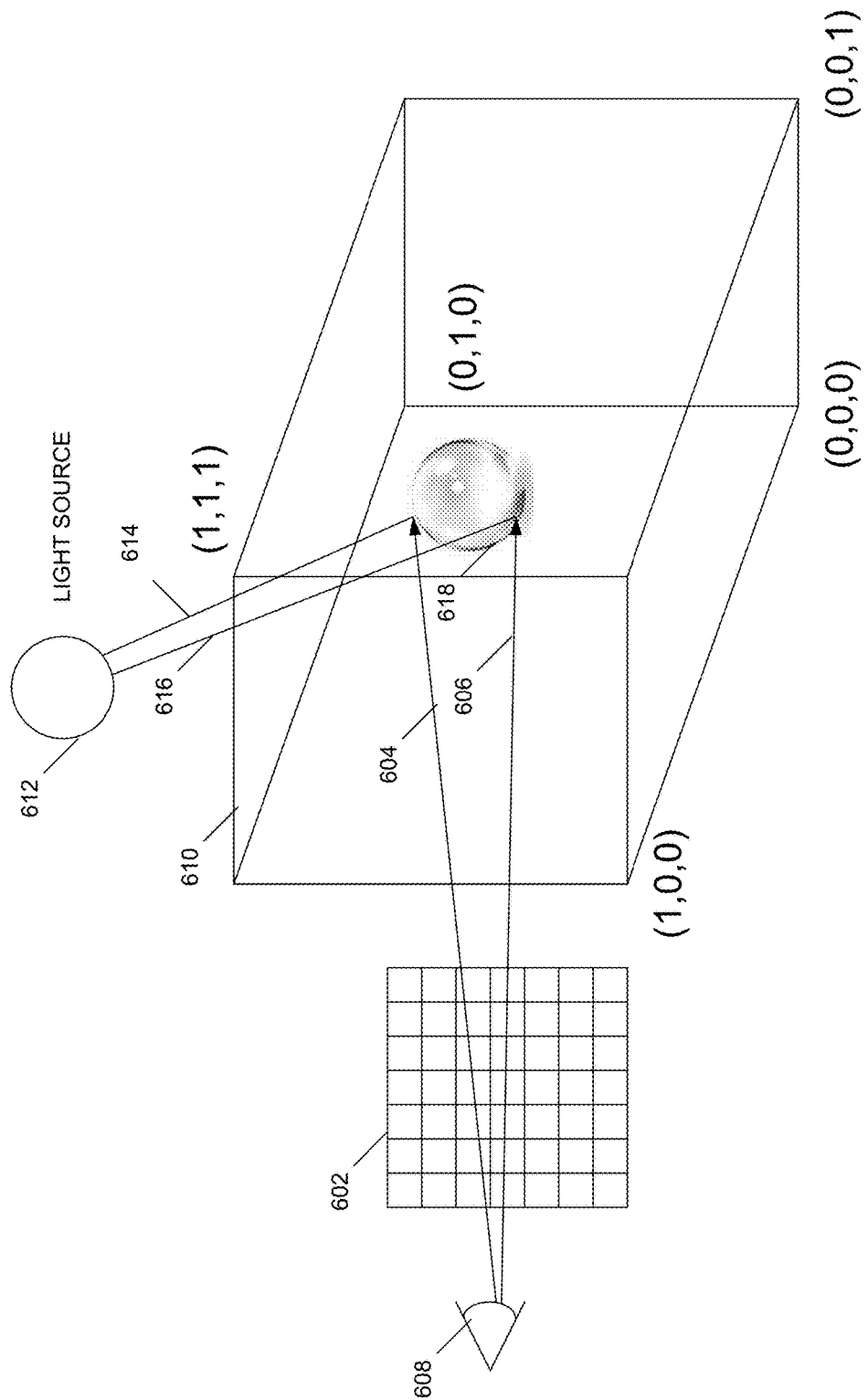
FIG. 6 is a diagram depicting inputs to a three dimensional object display with shading.

As noted above, for each pixel having an associated ray that intersects a point that meets the visualization criterion (e.g., a display density threshold), the system for generating a physical model calculations a pixel value for display. In some implementations, the system incorporates a shading calculation to that pixel value determination, where such shading can improve the contrast of objects shown in the two dimensional display of the three dimensional volume, such as is shown in the shaded object depicted in FIG. 1. FIG. 6 is a diagram depicting inputs to a three dimensional object display with shading.

Similar to the process described with respect to FIGS. 4 and 5, a system determines which pixels of the display 602 have corresponding rays 604, 606 originating from a vantage point 608 that intersect a point in the three dimensional volume 610 that meets the visualization criterion of having a density greater than or equal to the display density threshold. In the example of FIG. 6, each of rays 604, 606 ends at a point that meets the visualization criterion. For each of those points in the three dimensional volume 610, the system determines whether those points are shaded with respect to a positioning of a light source 612. For the point at the end of ray 604, the system identifies points in the three dimensional volume 610 along a line 614 between the identified point at the end of ray 604 and the light source 612. If any points along the line 614 have a corresponding density data value that meets a shading threshold, then that point is deemed to be shaded and a pixel value for the display 602 is selected accordingly. Because no point in the three dimensional volume along line 614 has a density data value that meets the shading threshold, the point at the end of ray 604 is deemed to be unshaded, and a pixel value is selected accordingly. In contrast, for the point at the end of ray 606, the line 616 between that identified point and the light source 612 traverses a portion of the sphere object 618, which includes points that have a density data value greater than the shading threshold. Because that point is deemed to be shaded, a darker pixel value is selected for display in the two dimensional visualization 602.

Figure 7:
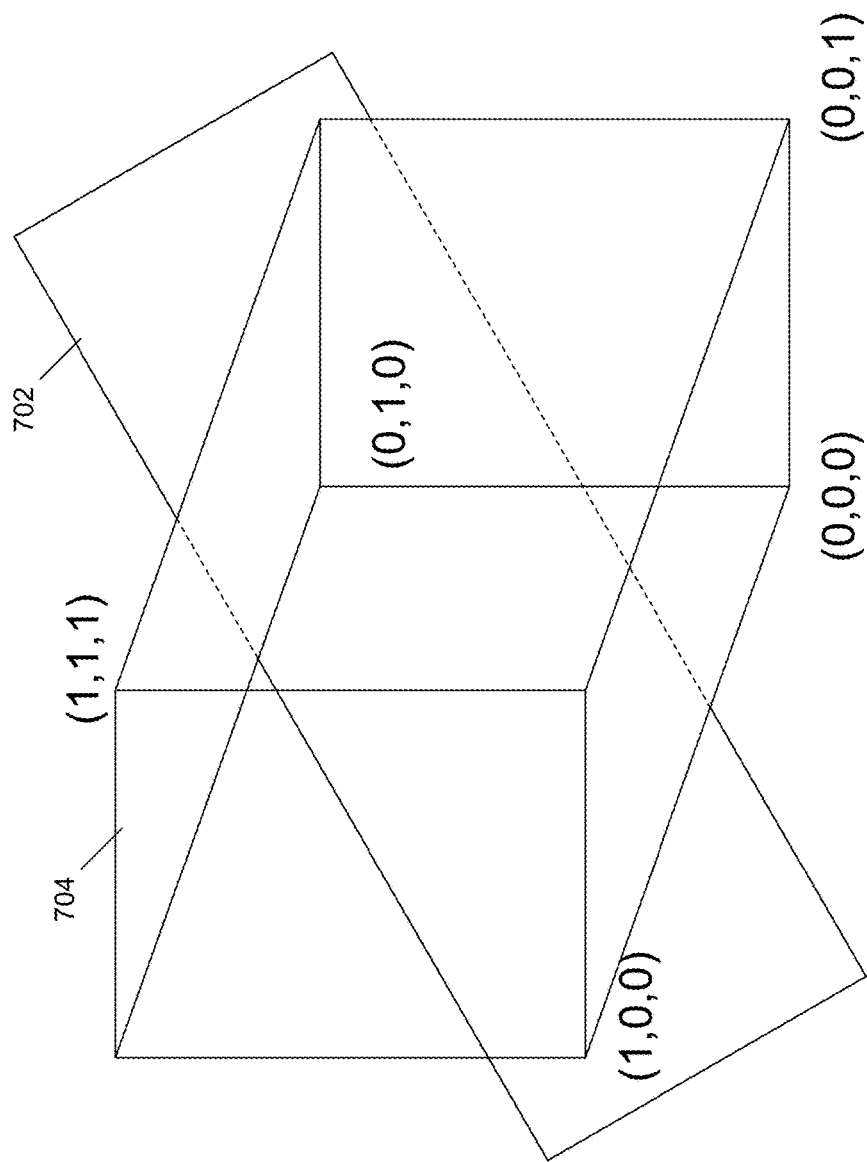
FIG. 7 depicts incorporation of a geometric boundary visualization criterion.
Figure 8:
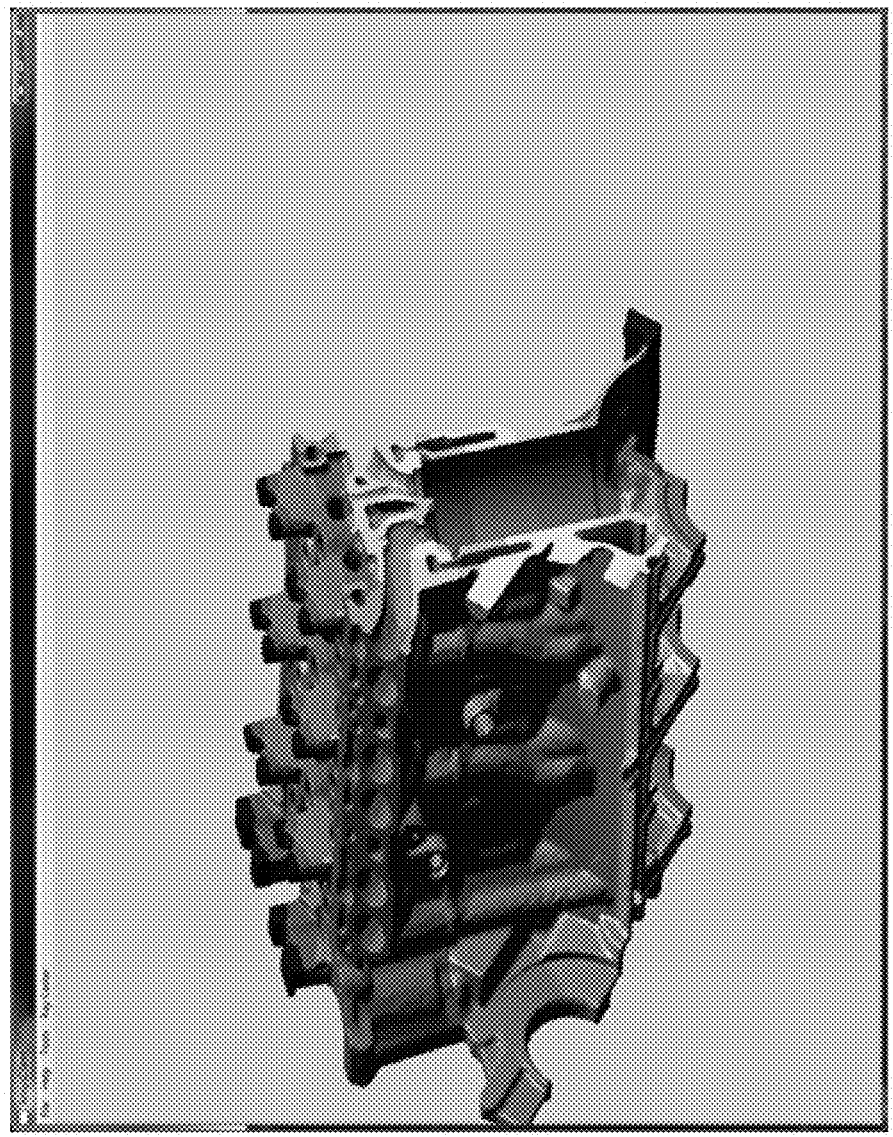
FIG. 8 is an example two dimensional display of a three dimensional volume that includes a mechanical object.

While the examples of FIGS. 4-6 utilized a display density threshold as the visualization criterion, a system may utilize a number of other visualization criteria, alone or in combination. For example, FIG. 7 depicts incorporation of a geometric boundary visualization criterion (e.g., a plane, a sphere, or other surface). The geometric boundary in FIG. 7 takes the form of a plane 702 that intersects the three dimensional volume 704. The visualization criterion commands, for each pixel of a two dimensional display, visualization of a first identified point along a corresponding ray that intersects the geometric boundary (e.g., plane 702) within the three dimensional volume 704. The pixel value for that pixel is determined based on whether that first identified point has a density data value that meets a display density threshold. For pixels having rays that do not intersect the geometric boundary, another visualization criterion is utilized to determine a corresponding pixel value (e.g., a display density threshold-only criterion as described with respect to FIGS. 4-6, automatic selection of a default or background pixel value). FIG. 8 is an example two dimensional display of a three dimensional volume that includes a mechanical object. By applying a plane geometric boundary visualization criterion, and moving the plane through the three dimensional volume and the mechanical object, an interior of the mechanical object can be visualized. The example of FIG. 8 also includes shading processing to calculate pixel values for depicted points in the three dimensional volume.

Figure 9:
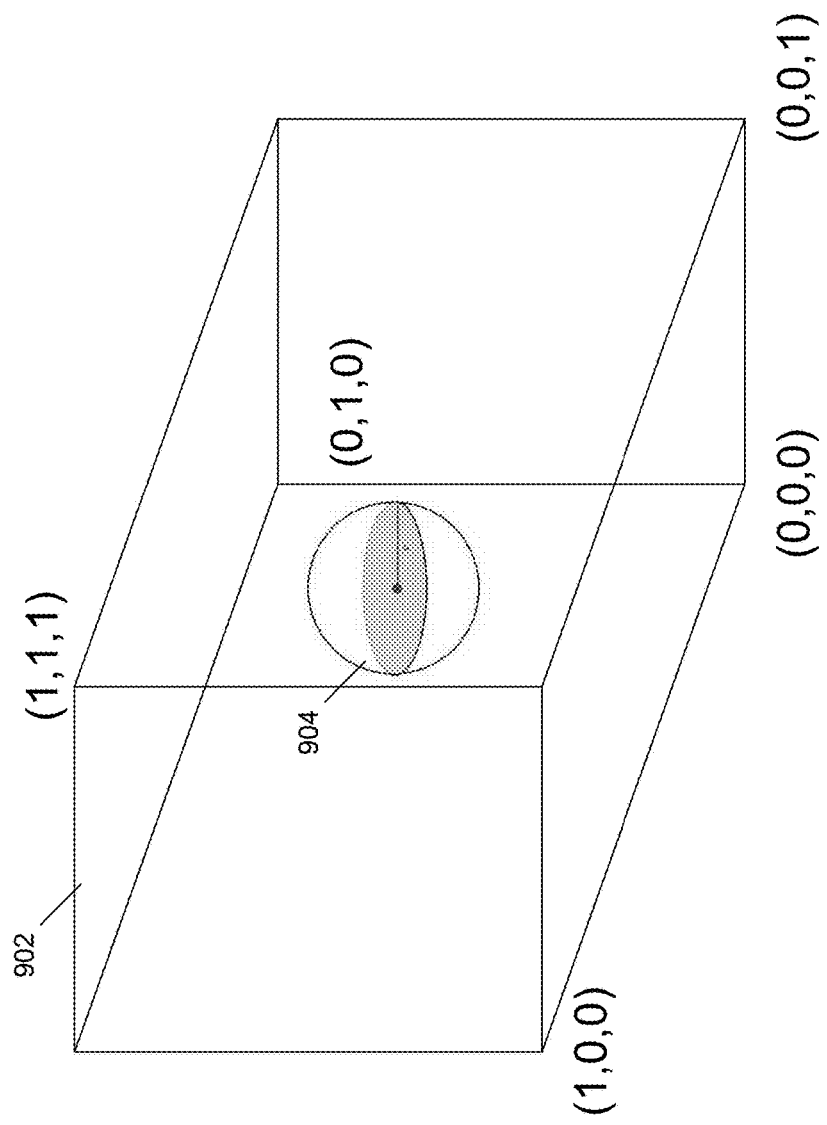
FIG. 9 depicts another geometric boundary visualization criterion in the form of a sphere.
Figure 10:
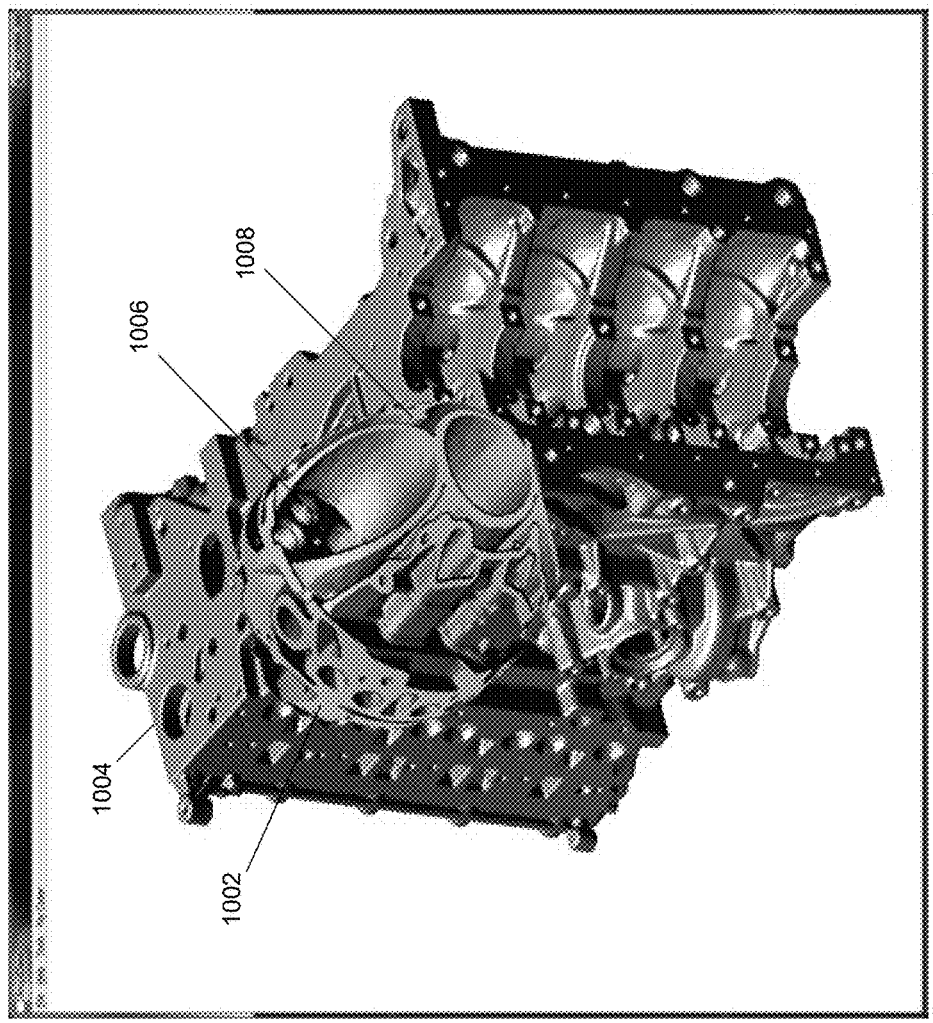
FIG. 10 depicts an example two dimensional visualization that commands display of a first point that intersects a sphere for rays that intersect the sphere.

FIG. 9 depicts another geometric boundary visualization criterion in the form of a sphere. The sphere visualization criterion commands visualization of a first identified point in the three dimensional volume 902 along a ray that intersects the sphere 904, having a radius r. FIG. 10 depicts an example two dimensional visualization that commands display of a first point that intersects a sphere 1002 for rays that intersect the sphere 1002. For rays that do not intersect the sphere 1002, a first point having a density data value that is greater than or equal to a display density threshold is displayed (e.g., at point 1004).

As discussed above, once a point in the three dimensional volume meets a visualization criterion and is to be displayed, a system determines a pixel value to be depicted for the corresponding point in the two dimensional visualization. In previously described examples, default displayed point pixel values and shading adjusted pixel values were depicted for points selected for display. In the example of FIG. 10, the pixel value for pixels having rays that intersect the sphere 1002 are selected based upon a value contained in a results data structure. A results data structure identifies physical values at the points within the three dimensional volume. For example, the results data structure may contain data that indicates temperature, pressure, force, stress, strain, deformation, or velocity at points within the three dimensional volume. In FIG. 10, pixels representing points at the intersection of corresponding rays and the sphere 1002 are colored based on a temperature value for those points in the results data structure. For example, points at 1006 are colored red, representing high temperatures, where points at 1008 are colored blue-green, representing lower temperatures.

In addition to determining pixel values for displayed points based on results data values, certain calculations can be made and displayed based on characteristics of displayed points as represented by the results data structure. For example, a cross sectional area of displayed points can be determined and displayed as well as average values, such as average temperature of displayed points. Additional calculations that can be performed and displayed include: volume, area, line, point calculations and integrations; del, div, and curl operations; reductions of all types (e.g., add, sub, min, max, avg, stddev); matrix and vector math; fluids calculation (e.g., particle tracing, particle tracking, helicity);

acoustics and HF EMAG calculations (e.g., frequency response, radiation); structural calculations (e.g., strain energy, center of gravity, force on a surface); and thermal calculations (e.g., Q through a surface, enthalpy).

Figure 11:
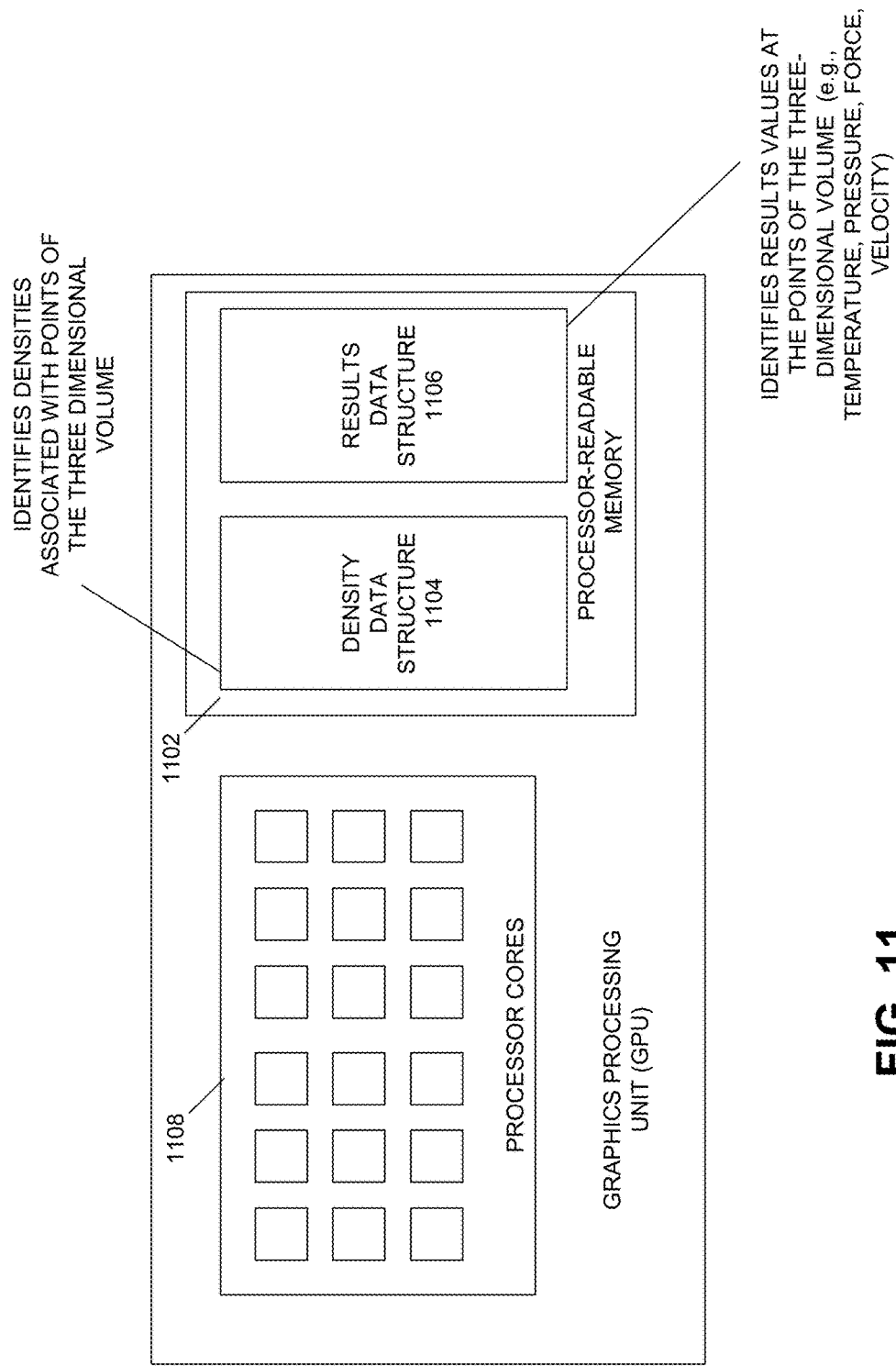
FIG. 11 is a block diagram depicting components of an example system for generating a physical model for engineering design or visualization.

FIG. 11 is a block diagram depicting components of an example system for generating a physical model for engineering design or visualization. The system includes a processor-readable memory 1102 that includes data structures containing physical data associated with points in a three dimensional volume. The data structures include a density data structure 1104 for storing density data that identifies densities at points in the three dimensional volume. The data structures further include a results data structure 1106 that stores results data that identifies physical values at points in the three dimensional volume. (In certain examples, the density data structure and the results data structure can be combined into a single data structure.) A plurality of data processors 1108 are configured to operate in parallel to perform calculations using the physical data (e.g., the density data and the results data) to generate a physical model for providing real time visualization and calculation associated with the three dimensional volume.

Figure 12:
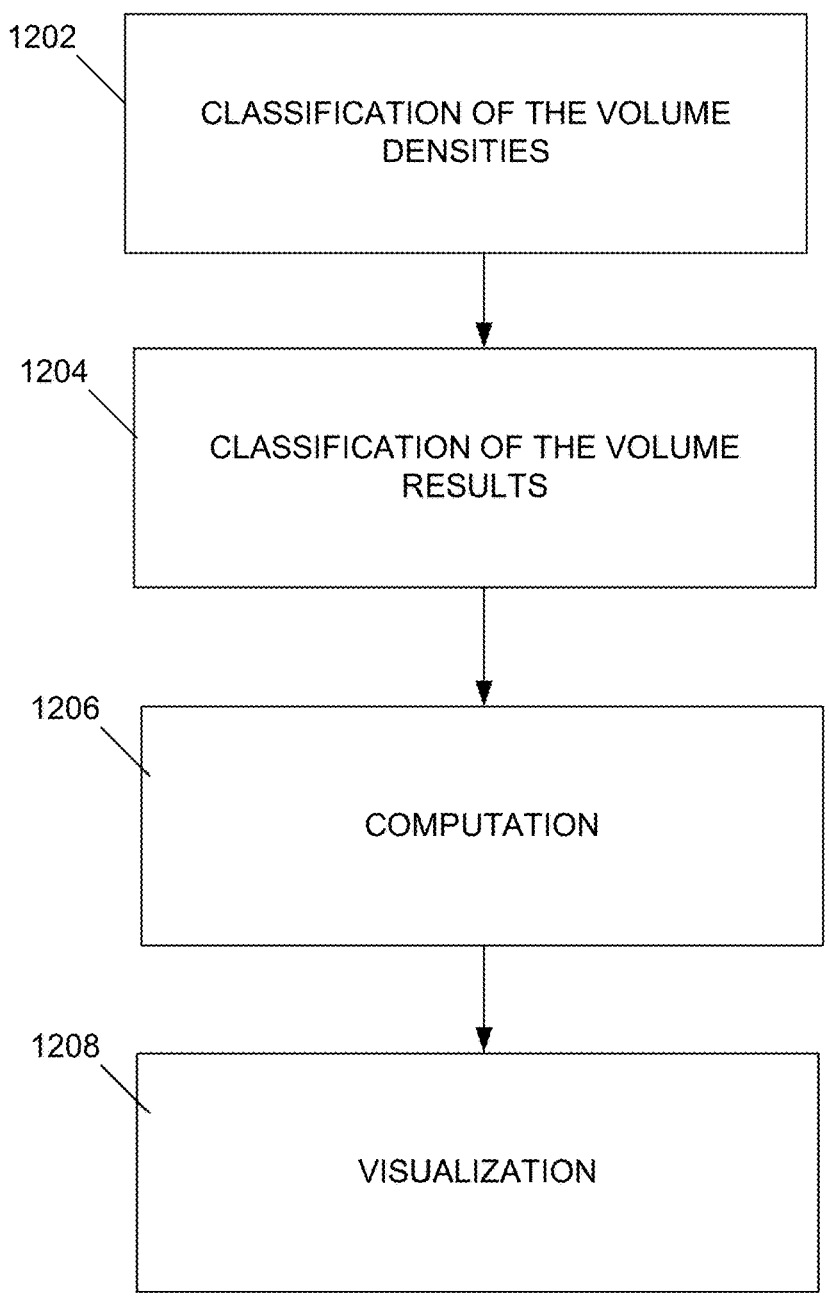
FIG. 12 is a flow diagram depicting an example process for generating a physical model for engineering design or visualization.

FIG. 12 is a flow diagram depicting an example process for generating a physical model for engineering design or visualization. At 1202, a density data structure that identifies densities at points in a three dimensional volume is populated using selected data from an external data source. The density data structure is stored on a processor-readable memory that is local to a plurality of data processors that will process the density data to generate the physical model. By populating the local density data structure, the plurality of data processors can have very fast access to the data needed to generate the physical model (e.g., using a GPU architecture). The external data source that provides the data for populating the density data structure can be of arbitrary size, where the system can populate the local density data structure with only a portion of the data in the external data source, such as only data associated with a three dimensional volume of interest within a larger global volume represented by the external data source.

At 1204, a results data structure that identifies physical values at the points in the three dimensional volume is populated using selected data from the external data source. At 1206, computation is performed to identify pixel values for each pixel of a two dimensional visualization of the three dimensional volume, such as using one of the procedures described herein, and at 1208, the pixel values are displayed on a computer display device.

Figure 13:
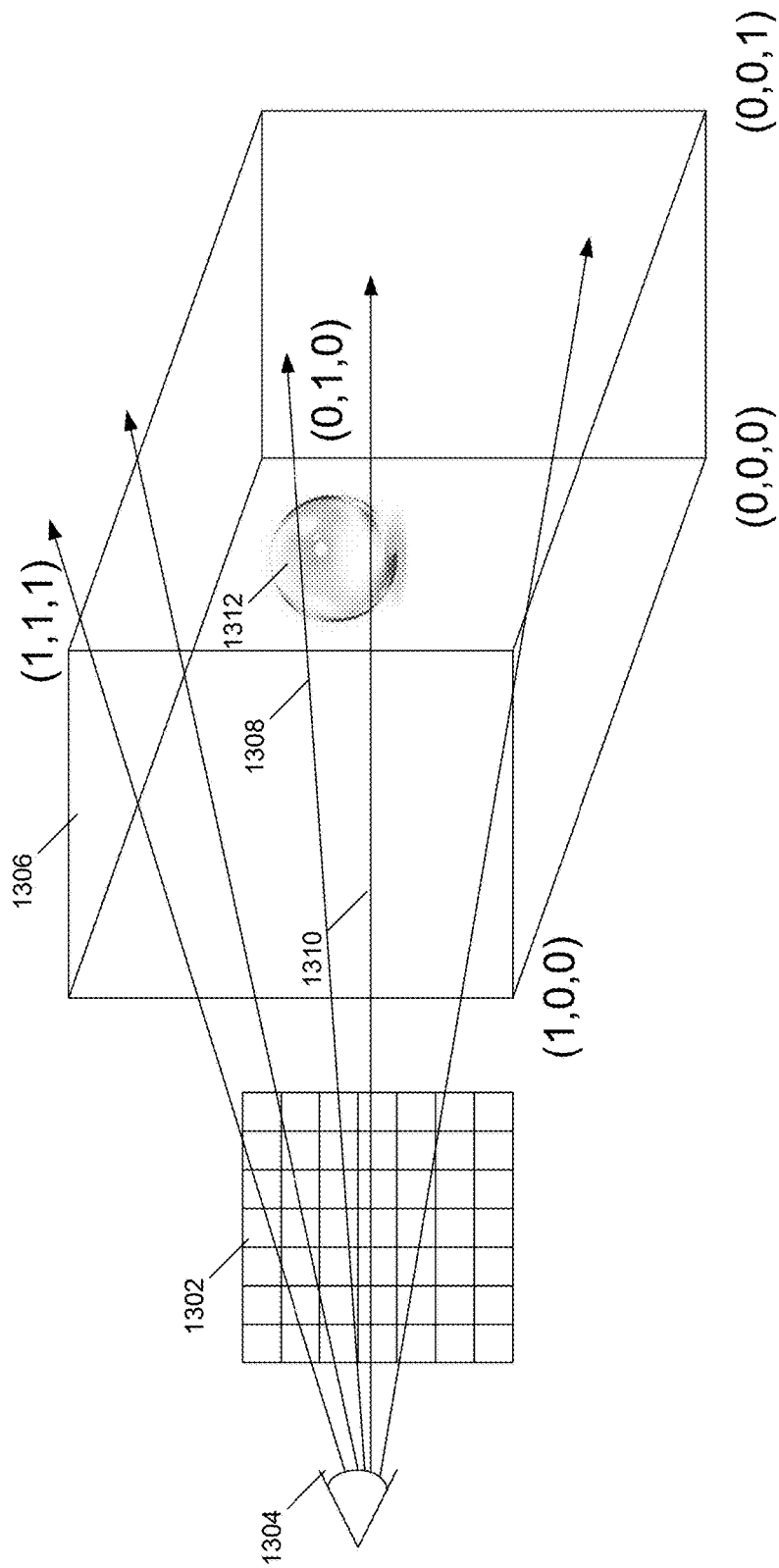
FIG. 13 is a diagram depicting analysis of rays fully traversing the three dimensional volume.

In the preceding examples, visualization criteria were described that traversed rays until a certain display criterion was met (e.g., first point having a density data value greater than a display density threshold, the point where ray intersects a geometric boundary). Certain visualization criteria dictate that points along each ray be considered throughout their entire traversal of the three dimensional volume (e.g., display points having a minimum or maximum results data value along each ray). FIG. 13 is a diagram depicting analysis of rays fully traversing the three dimensional volume. For each pixel of a display 1302, a ray is traversed from a vantage point 1304, through that pixel in the display 1302 and through the three dimensional volume 1306. For example, rays 1308, 1310 traverse the full width of the three dimensional volume despite their intersection with sphere object 1312. The points along the rays are analyzed to determine which points, if any meet a visualization criterion. For example, a visualization criterion that requires display of a highest temperature point above a threshold along the rays would necessitate consideration of all points within the sphere object 1312 along the ray.

Figure 14:
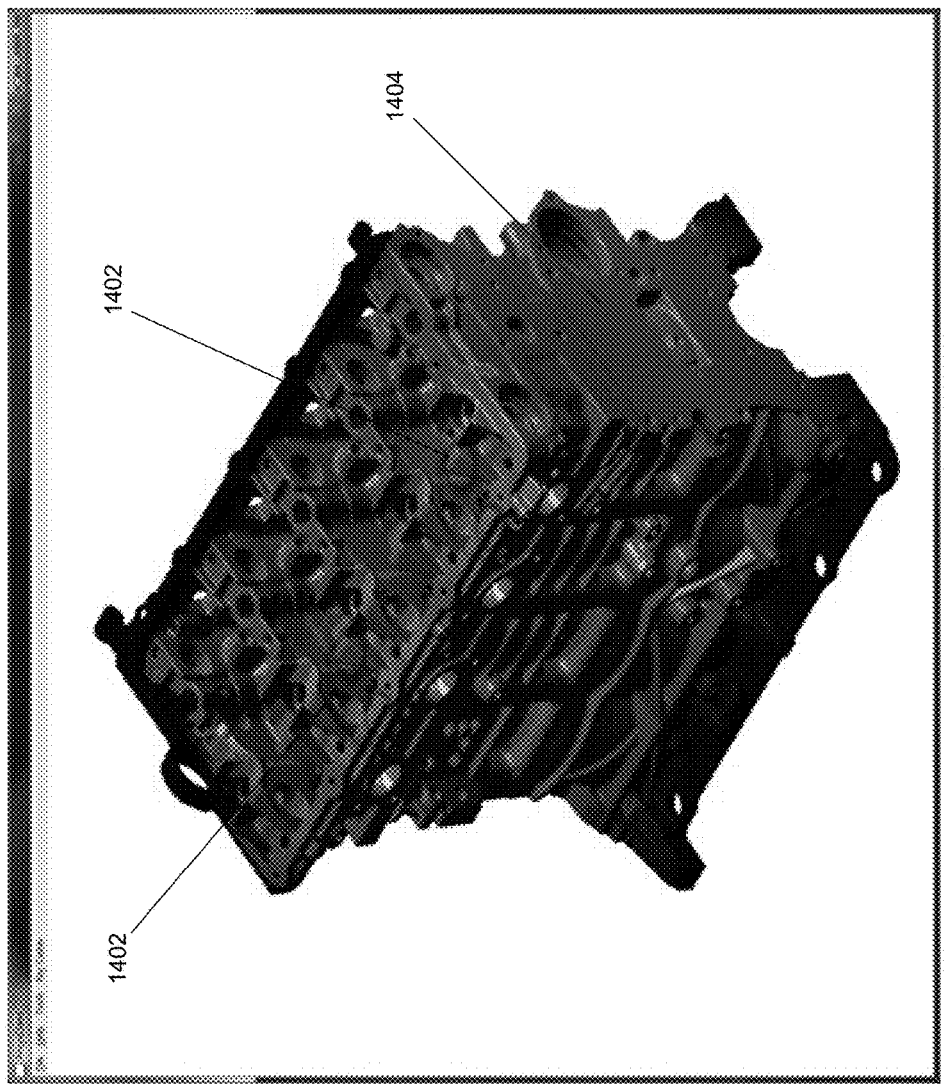
FIG. 14 depicts an example two dimensional visualization of a three dimensional volume that identifies maximum temperature locations within the depicted object.
Figure 15:
FIG. 15 depicts a two dimensional visualization based on a visualization criterion where all points within a temperature range along each ray are depicted using a corresponding color value.

FIG. 14 depicts an example two dimensional visualization of a three dimensional volume that identifies maximum temperature locations within the depicted object. The example visualization utilizes two visualization criteria that are applied in a precedential order. A first priority visualization criterion instructs depiction of a maximum temperature point along a ray, where that maximum temperature point must be above a display threshold. Examples of points depicted based on this visualization criterion are shown in red at 1402 and identify hot spots within the depicted object. These points are identified based on consideration of the results data structure values for points within the depicted object. A second priority visualization criterion instructs, for pixels not having corresponding pixel values set based on the first priority visualization criterion, depiction of a first point along a ray that meets a display density threshold. The points displayed based on the second priority visualization criterion are also colored based on the corresponding results data for those points, where those surface points are depicted in lighter colors (e.g., at 1404) based on the lower results data values. FIG. 15 depicts a two dimensional visualization based on a similar visualization criterion, where all points within a temperature range along each ray are depicted using a corresponding color value.

Figure 16:
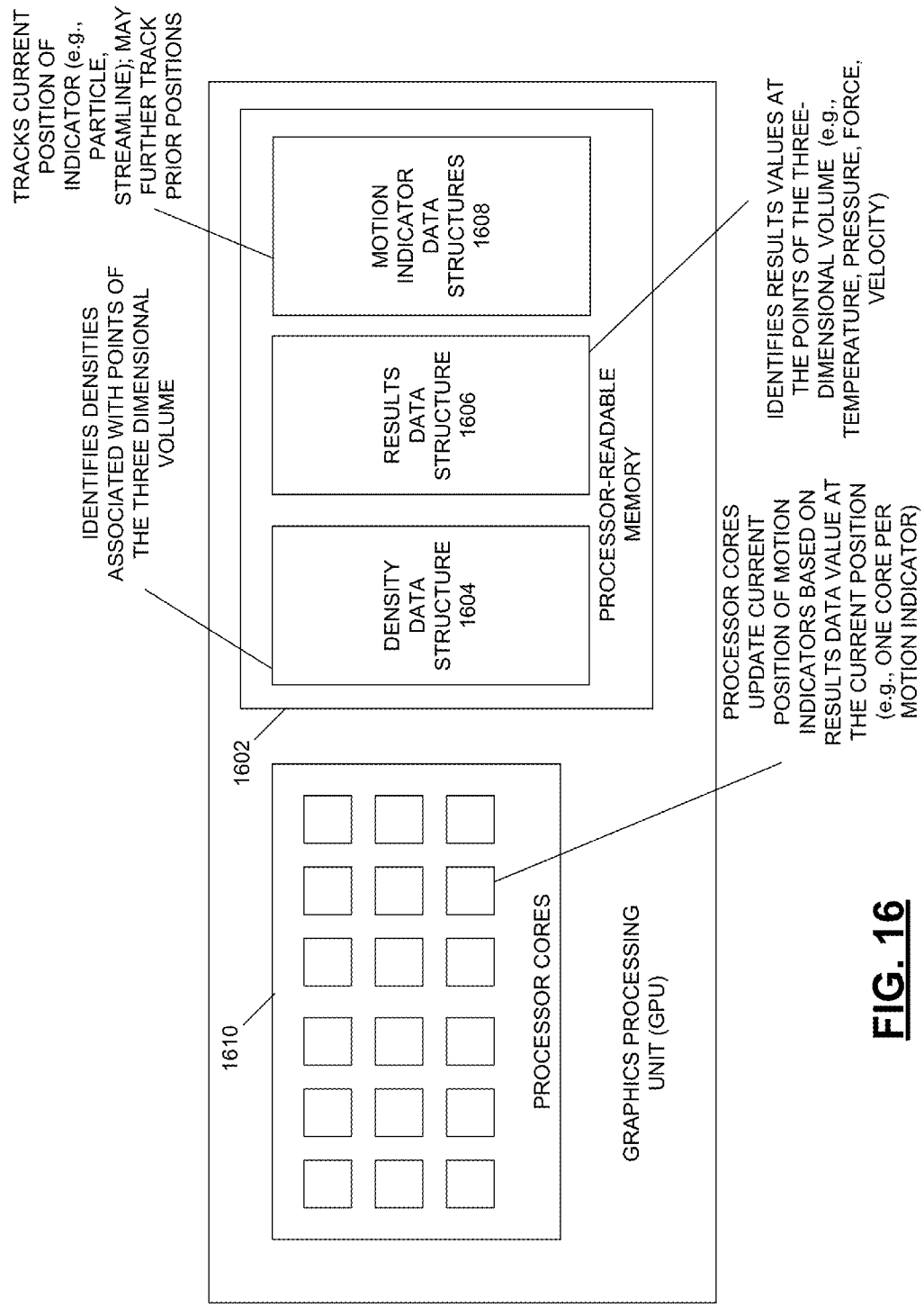
FIG. 16 is a block diagram depicting a system for generating a physical model for engineering design or visualization that includes a motion indicator data structure.

As noted above, results data in a results data structure can represent a variety of properties within the three dimensional volume. For example, the results data structure could be configured to store wind or other types of velocities within the three dimensional volume. Motion indicators can be injected into a visualization and tracked to depict the effect of the results data in the three dimensional volume on those hypothetical particles injected into the volume. FIG. 16 is a block diagram depicting a system for generating a physical model for engineering design or visualization that includes a motion indicator data structure. The system includes a processor-readable memory 1602 that includes a density data structure 1604 for storing density data that identifies densities at points in the three dimensional volume and a results data structure 1606 for storing results data that identifies physical values at the points in the three dimensional volume. The one or more processor-readable memories further include one or more motion indicator data structures 1608 that track current, and in some implementations past, positions of motion indicators included in the three dimensional volume.

Figure 17:
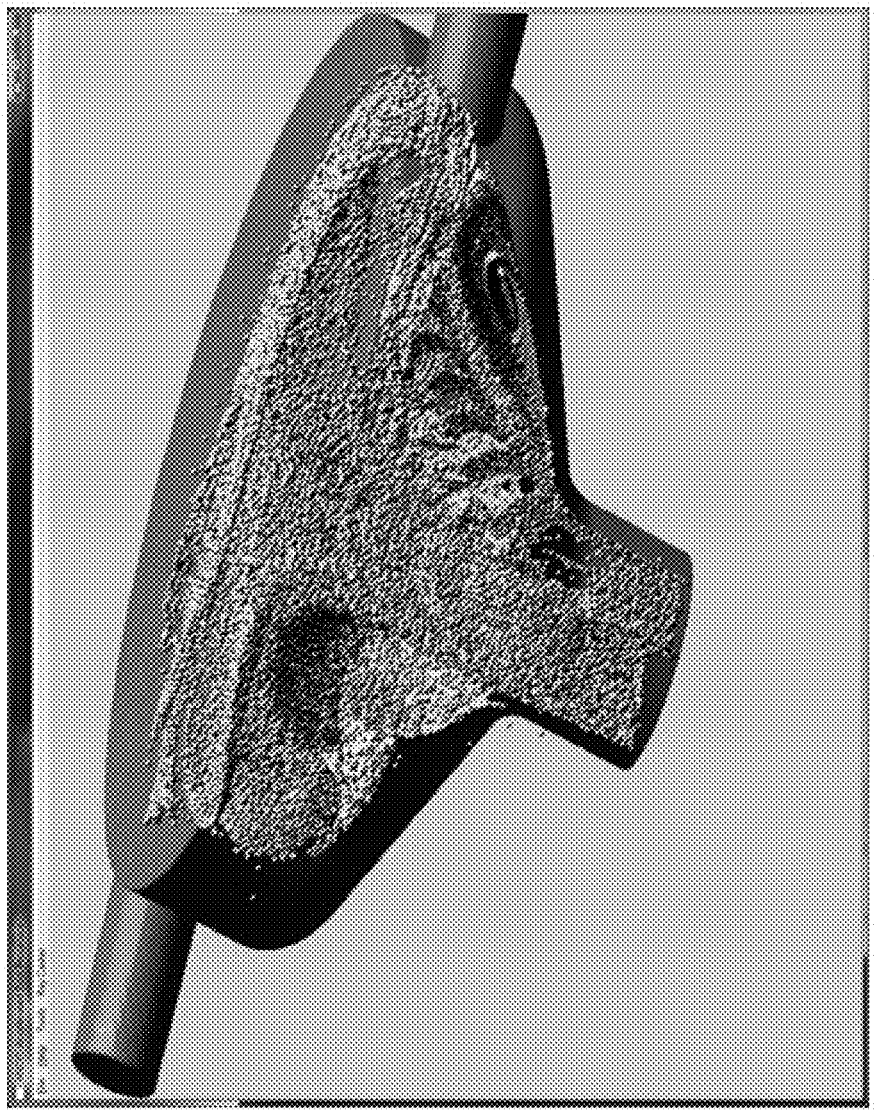
FIG. 17 is a diagram depicting current positions of particles based on their location as indicated in a motion indicator data structure.
Figure 18:
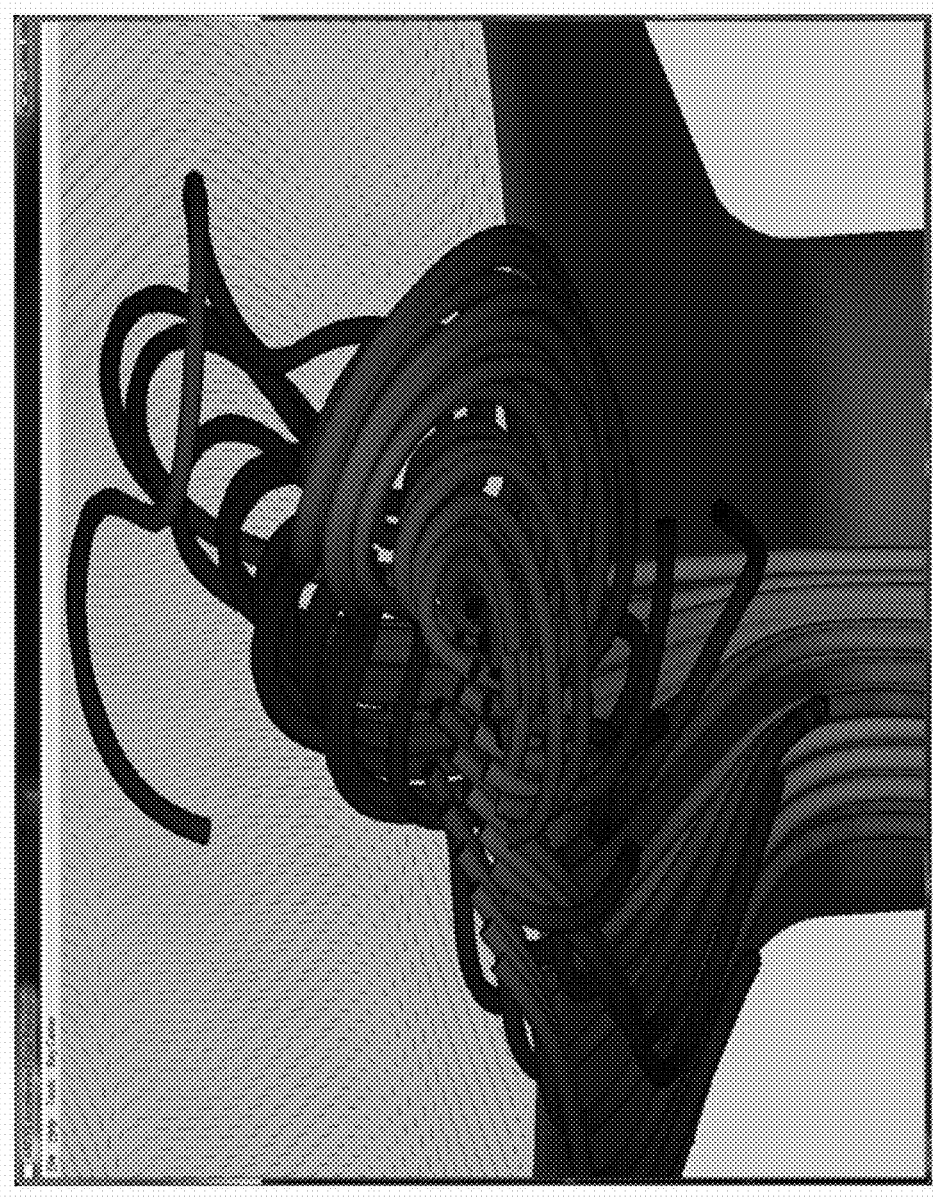
FIG. 18 is a diagram depicting current and past positions of the particles as indicated in the motion indicator data structure.
Figure 19:
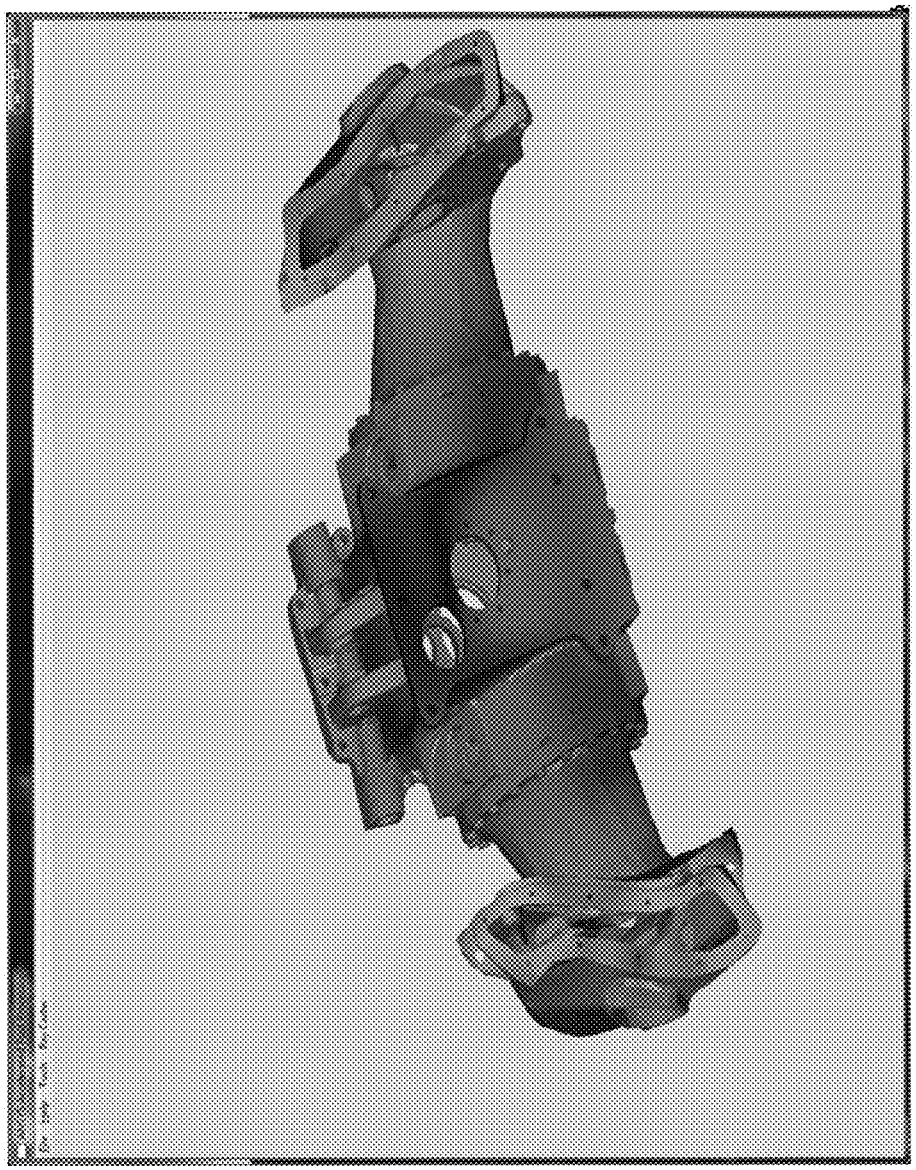
FIG. 19 depicts one frame of an animation of an object being deformed based on influences from force results data in the results data structure.

Motion indicators tracked by motion indicator data structures 1608 can be displayed in a variety of ways. For example, motion indicators can have their current location depicted as a particle in the three dimensional volume, with particle positions being continually updated by the plurality of data processors 1610. FIG. 17 is a diagram depicting current positions of particles based on their location as indicated in a motion indicator data structure. The display of FIG. 17 can be updated (e.g., continuously) to show the changes in particle position based on the influence of results data physical values within the three dimensional volume, where the plurality of data processors are configured to perform a physics-type calculation on the particle position based on each particle's current position and physical values from the results data structure to determine an updated particle position for each particle. For example, where the results data indicates fluid velocity and direction at points in the three dimensional volume, the position of each fluid particle is updated (e.g., based on a frame rate of the system) to determine where that fluid particle will be at the time of the next screen refresh, based on the fluid velocity at that fluid particle's current position (e.g., position at time t+1=position at time t+velocity and direction of particle at time t+velocity data (position at time t)). In another example, motion indicator data structures also track past positions of the motion indicators. FIG. 18 is a diagram depicting current and past positions of the particles as indicated in the motion indicator data structure. Each particle's current position and past positions are depicted as a streamline, where, like the example of FIG. 17, the display can be updated to show continued effects of the physical values in the results data structure on the motion indicators. Motion indication calculation can also be performed to identify the movement of textures of an object being displayed based on forces indicated in the results data structure. FIG. 19 depicts one frame of an animation of an object being deformed based on influences from force results data in the results data structure.

Figure 20:
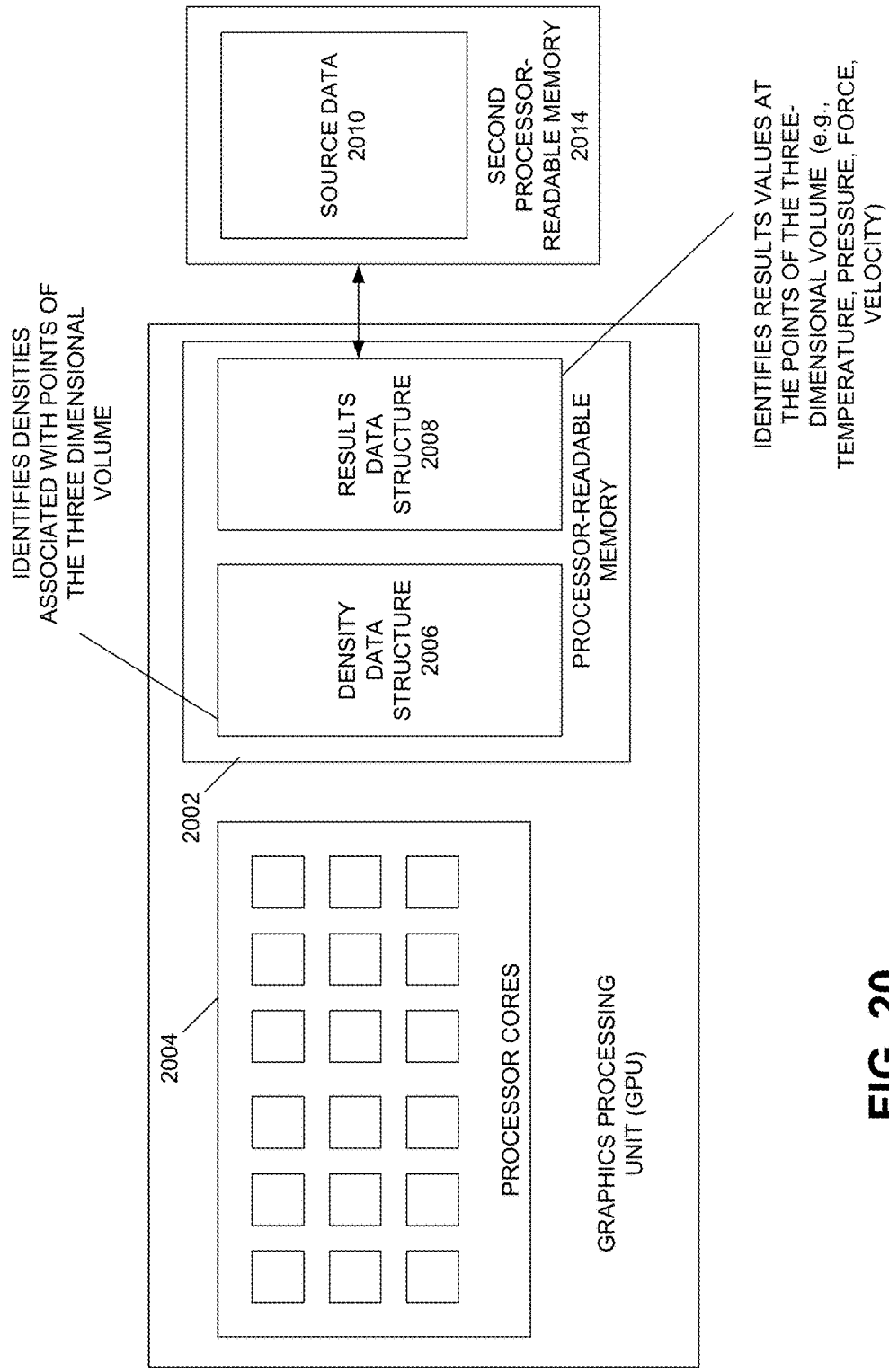
FIG. 20 is a block diagram depicting a system for generating a physical model for engineering design or visualization having data structures populated from an external data source.

FIG. 20 is a block diagram depicting a system for generating a physical model for engineering design or visualization having data structures populated from an external data source. A processor-readable memory 2002 is positioned locally to a plurality of data processors 2004 that are configured to operate in parallel to perform calculations using the data stored in the processor-readable memory 2002. The data structures include a density data structure 2006 and a results data structure 2008. The data structures 2006, 2008 are populated using data from a source data set 2010, which may be stored on a second processor-readable memory 2014 that is external from the data processors 2004 and the processor-readable memory 2002. For example, the density data structure 2006 and the results data structure 2008 may be populated with data from one or more source data structures stored on the second processor-readable memory 2014. In other examples, the density data structure 2006 and the results data structure 2008 are populated from some other external data source, such as a stream of data from a software computation module or a collection of unstructured data.

Figure 21:
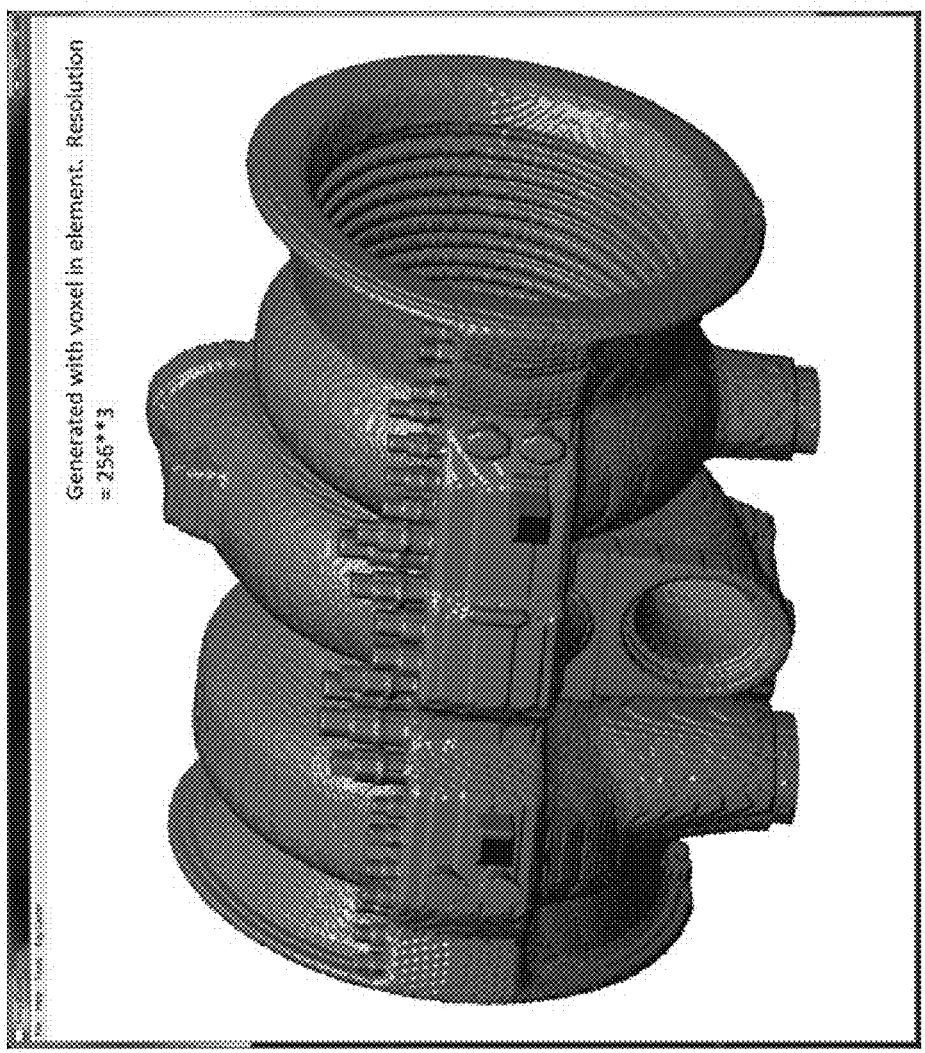
FIGS. 21 and 22 depict an example two pass population of density data structure.
Figure 22:
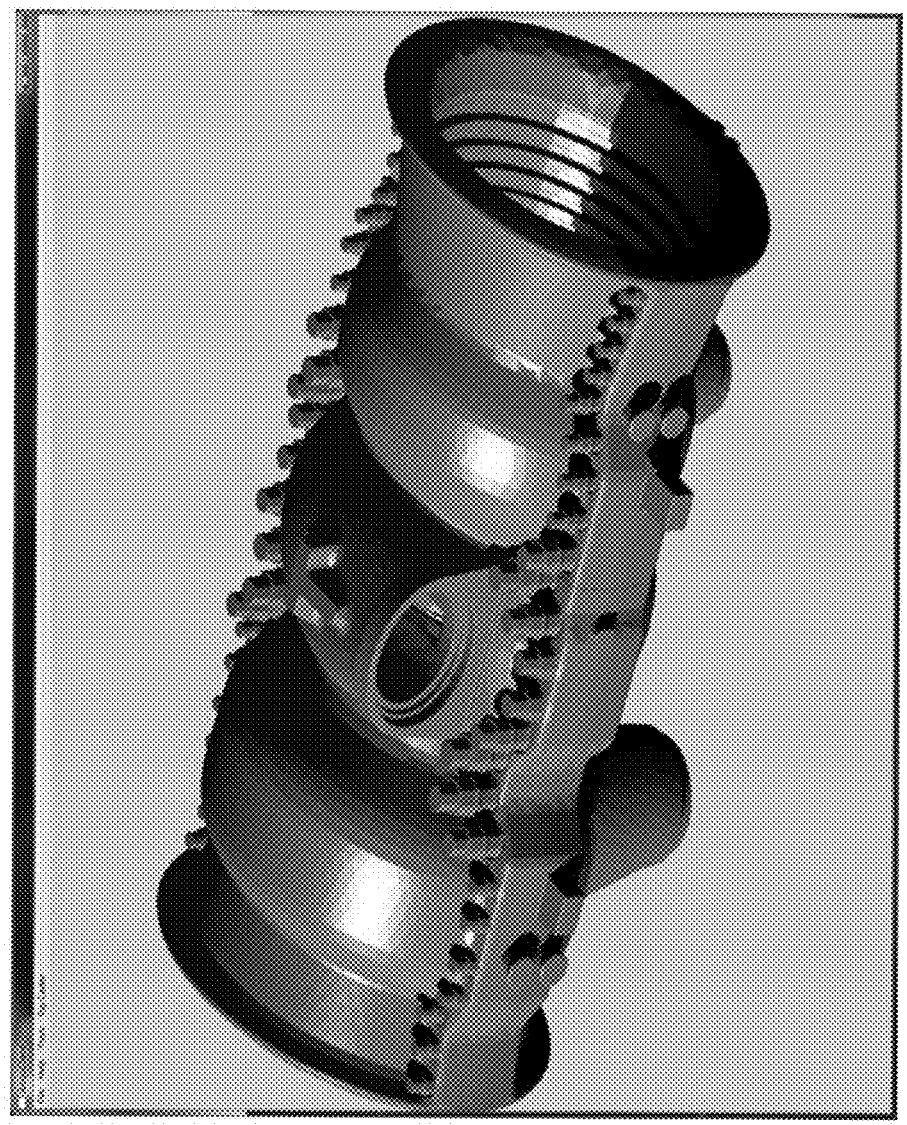

In one example, the source data structures 2010, 2012 are of arbitrary size which may be substantially greater than the size of the local data structures 2006, 2008. For example, the source data structures 2010, 2012 may contain density data and results data for an entirety of a global three dimensional volume, while the local density data structure 2006 and results data structure 2008 are configured to store data for a three dimensional volume of interest. Thus, the density data structure 2006 and the results data structure 2008 may be populated utilizing a sampling operation on the external data structures 2010, 2012. For example, based on a size of a three dimensional volume of interest within the global three dimensional volume, the system will sample points within the global three dimensional volume stored on the second processor-readable medium 2014 (e.g., sample enough data points to fill the data structure 2006, 2008 on the local processor-readable memory 2002) to populate the data structures on the local processor readable memory 2002. The system may be configured to repopulate the local data structures 2006, 2008 from the external data source 2014 based on a change to the three dimensional volume of interest (e.g., based on a user zoom in/zoom out command, based on a user adjustment of the three dimensional volume of interest) using a different subset of data from the external data source 2014. FIGS. 21 and 22 depict an example two pass population of a density data structure, where in a first pass depicted in FIG. 21, a rough set of points in the three dimensional volume are sampled to determine whether those points are inside or outside of the object in the three dimensional volume. For points deemed near the surface of the object, surrounding points are sampled in the source data structure, as shown in FIG. 22, to identify or interpolate density data values (e.g., points are identified as 0 or 1 in first pass and are refined to values between 0-1 in the second pass).

Figure 23:
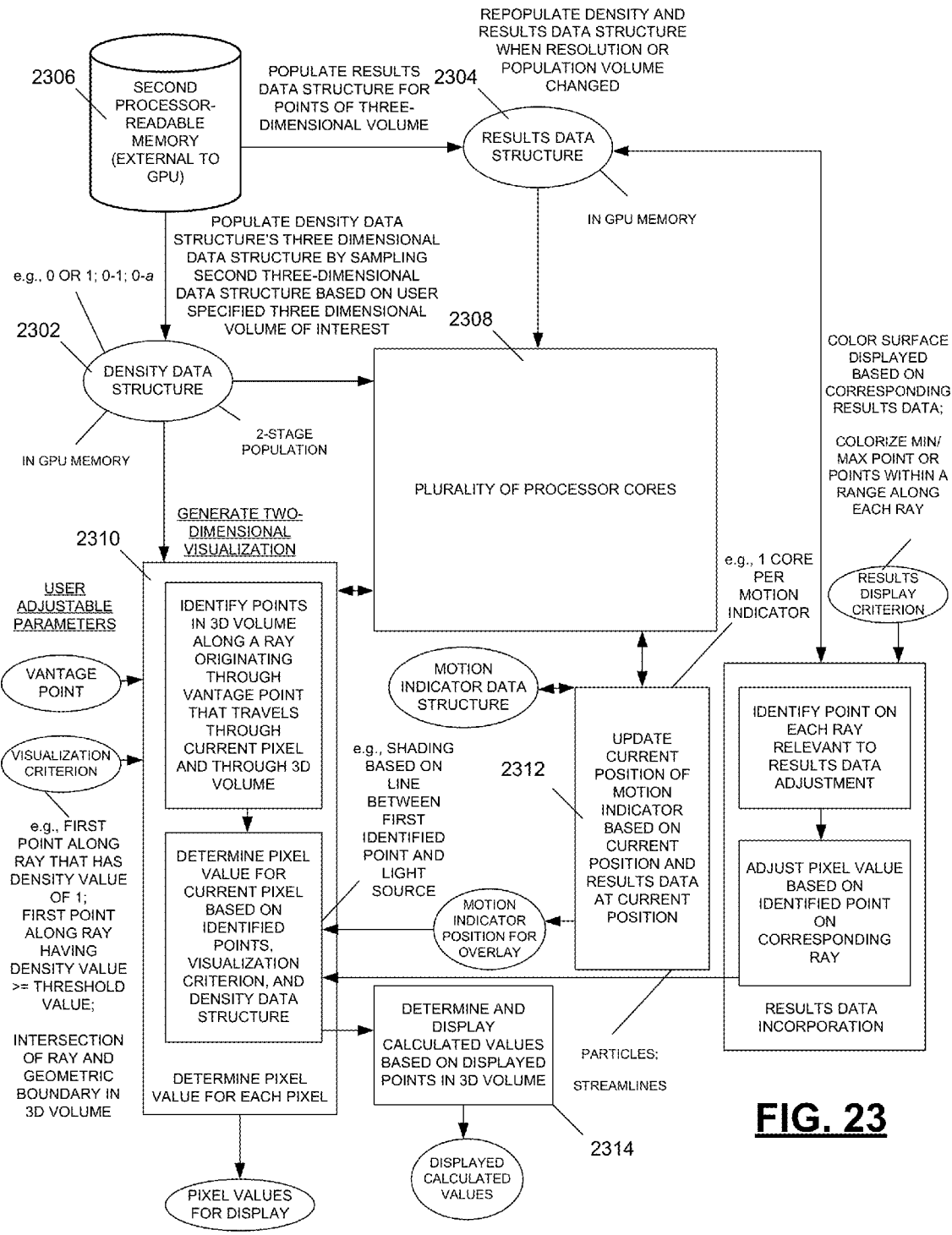
FIG. 23 is a diagram depicting example features of a system for generating a physical model for engineering design or visualization.

FIG. 23 is a diagram depicting example features of a system for generating a physical model for engineering design or visualization. A system includes a processor readable memory that stores one or more data structures containing physical data associated with points in a three dimensional volume. The example of FIG. 23 includes a density data structure 2302 stored in a GPU memory for storing density data that identifies densities at points in a three dimensional volume and a results data structure 2304 for storing results data that identifies physical values at the points in the three dimensional volume. The density data structure 2302 and results data structure 2304 are populated from a second processor-readable memory 2306 that is external to the GPU. A plurality of data processors 2308 are configured to operate in parallel to perform calculations using the physical data in the one or more data structures 2302, 2304 to generate a physical model for providing real time visualization and calculation associated with the three dimensional volume. For example, the plurality of data processors 2308 are configured to generate a two dimensional visualization of the three dimensional volume at 2310 by identifying points in the three dimensional volume on rays from a vantage point through pixels of the display that meet a visualization criterion and determining a pixel value for those identified points, such as using results data. The system is also configured to track and display motion indicators using a motion indicator data structure as depicted at 2312, where time varying positions of motion indicators is influenced by results data from the results data structure 2304. A system can also be configured to make certain calculations and display results of those calculations based on characteristics of displayed points as represented by the results data structure, as indicated at 2314. For example, a cross sectional area of displayed points can be determined and displayed as well as average values, such as average temperature of displayed points.

This application uses examples to illustrate the invention. The patentable scope of the invention includes other examples.

It is claimed:

1. A system for generating a physical model for engineering design or visualization, comprising:
   a processor-readable memory, wherein the processor-readable memory includes:
      one or more data structures containing physical data associated with points in a three dimensional volume, the one of more data structures including:
         a density data structure for storing density data corresponding to the points for identifying whether each of the points is within or outside the three dimensional volume,
         wherein the density data takes a plurality of discretized values with a pre-determined maximum value and a pre-determined minimum value,
         wherein the pre-determined maximum value is larger than the pre-determined minimum value, the plurality of discretized values between the pre-determined maximum value and the pre-determined minimum value, wherein when the point is within the three dimensional volume, the value of the density data corresponding to the point is equal to the pre-determined maximum value, wherein when the point is outside the three dimensional volume, the value of the density data corresponding to the point is equal to the pre-determined minimum value, wherein when the point is on the boundary of the three dimensional volume, the value of the density data corresponding to the point is equal to one of the plurality of pre-determined discretized values between the pre-determined maximum value and the pre-determined minimum value; and a results data structure for storing results data, wherein the results data identifies physical values at the points in the three dimensional volume, wherein the results data is distinct from the density data; and a plurality of data processors that operate in parallel to perform calculations using the physical data to generate a physical model for providing real-time visualization and calculation associated with the three dimensional volume, wherein providing the visualization includes:

for a particular pixel, identifying a first point in the three dimensional volume along a ray originating from a vantage point having a corresponding density data structure density that meets a visualization criterion; and determining a pixel value for the particular pixel based on a results data structure value that corresponds with the first identified point in the three dimensional volume.

2. The system of claim 1, where in the results data is indicative of temperature, pressure, force, or velocity at points of the three dimensional volume.

3. The system of claim 1, wherein the visualization of the physical model includes a two dimensional visualization of the points in the three dimensional volume or a calculated value based on the densities and the physical values.

4. The system of claim 1, wherein the system is configured to generate a two dimensional visualization of the three dimensional volume for display on a display device.

5. The system of claim 4, wherein the two dimensional visualization is updated in real-time based on user input.

6. The system of claim 5, wherein the two dimensional visualization is updated within 30 milliseconds of receipt of the user input.

7. The system of claim 6, wherein the user input is a mouse input, a keyboard input, a touch screen input, or a stylus input.

8. The system of claim 1, wherein the density data includes a density value in a range of 0 and a display density threshold for each point of the three dimensional volume, wherein the visualization criterion includes the display density threshold, and wherein the visualization criterion commands visualization of the first identified point along the ray having a density value greater than or equal to the display density threshold.

9. The system of claim 8, wherein the data processors are configured to regenerate the two dimensional visualization based on a received change to the vantage point.

10. The system of claim 1, wherein determining the pixel value for the particular pixel further includes:

identifying points in the three dimensional volume along a line between the first identified point and a light source;

determining whether any points along the line have a corresponding density data value that meets a shading threshold; and determining the pixel value for the particular pixel based on whether any points along the line have a density data value that meets the shading threshold.

11. The system of claim 10, wherein when one or more points along the line have a density data value that meets the shading threshold, the pixel value is determined to be a darker pixel value based on the first identified point being shaded from the light source.

12. The system of claim 1, wherein in a second visualization, the visualization criterion commands visualization of a first identified point along the ray that intersects a geometric boundary within the three dimensional volume;

where in the pixel value for the particular pixel is determined based on whether the first identified point along the ray that intersects the geometric boundary has a density data value that meets a display density threshold.

13. The system of claim 12, wherein the geometric boundary is a plane that intersects the three dimensional volume.

14. The system of claim 12, wherein the geometric boundary is a sphere that is at least partially within the three dimensional volume.

15. The system of claim 12, wherein the visualization criterion commands visualization of a first identified point along the ray that intersects one of a plurality of geometric boundaries.

16. The system of claim 15, where in the plurality of geometric boundaries include a plane, a sphere, or a surface.

17. The system of claim 12, wherein when no points along the ray intersect the geometric boundary, the pixel value for the particular pixel is determined based on a first point identified along the ray that has a density data value that meets the display density threshold.

18. The system of claim 12, wherein the plurality of data processors are configured to calculate a value based on the first identified point along each of a plurality of rays that intersect the geometric boundary.

19. The system of claim 18, wherein the calculated value is an area or a temperature associated with all of the first identified points.

20. The system of claim 1, wherein the pixel value for the particular pixel is colored based on results data from the results data structure associated with the first point identified along the ray that has a density data value that meets the display density threshold.

21. The system of claim 1, further comprises determining every physical value for each point along a ray that passes through the three dimensional volume, wherein in a second visualization, the visualization criterion commands visualization of a point identified along the ray that is identified as having a minimum or maximum associated physical value of every physical value;

wherein the point identified along the ray as having the minimum or maximum associated results value is colored based upon the minimum or maximum associated results value.

22. The system of claim 1, wherein in a second visualization, the visualization criterion commands visualization of all points identified along the ray that are identified as having associated physical values within a range;

wherein the points identified along the ray as having associated physical values within the range are colored based upon the associated physical values.

23. The system of claim 1, wherein the processor-readable memory further includes a motion indicator data structure, wherein the motion indicator data structure is configured to store a current position of a motion indicator within the three dimensional volume.

24. The system of claim 23, wherein the motion indicator includes a particle, wherein the particle is displayed in the two dimensional visualization based on the current position of the motion indicator.

25. The system of claim 24, wherein the processor-readable memory includes multiple motion indicator data structures, and wherein the two dimensional visualization depicts multiple particles simultaneously.

26. The system of claim 23, wherein the motion indicator includes a stream line, wherein the streamline is displayed in the two dimensional visualization based on the current position of the motion indicator and a previous position of the motion indicator.

27. The system of claim 23, wherein the processor cores are configured to update the current position of a particular motion indicator based on results data associated with the current position.

28. The system of claim 27, wherein the processor cores are configured to update the current position of the particular motion indicator by performing a mathematical calculation based on the current position of the particular motion indicator and the results data association with the current position.

29. The system of claim 28, wherein the results data is indicative of a velocity and a direction at points in the three dimensional volume, wherein the processor cores are configured to update the current position of the particular motion indicator based on a velocity and direction associated with the current position in the results data structure and the current position of the particular motion indicator and a velocity and direction associated with the particular motion indicator.

30. The system of claim 1, wherein the processor-readable memory and the plurality of data processors are components of a graphics processing unit.

31. The system of claim 1, wherein the density data structure is generated based on a source data structure stored on a second processor-readable memory that is external to the graphics processing unit.

32. The system of claim 31, wherein source data structure density values are sampled based on a determination of whether a point associated within source data structure density value is in the three dimensional volume.

33. The system of claim 31, wherein the system is configured to generate the density data structure based on a source data structure of arbitrary size.

34. The system of claim 31, wherein the density data structure is generated based on a subset of the source data structure, wherein upon a zoom in or zoom out command, wherein the system is configured to regenerate the density data structure based on a different subset of the source data structure.

35. The system of claim 31, wherein the results data structure is populated from a second source data structure stored on the second processor-readable memory that is external to the graphics processing unit.

36. The system of claim 1, wherein the two dimensional visualization includes an animation based on the density data and the results data.

37. The system of claim 36, wherein the animation is based on force physical values in the results data structure, wherein the plurality of data processors are configured to determine deformations in the three dimensional volume based on the force physical values.

38. The system for generating a physical model for engineering design or visualization of claim 1, wherein providing the visualization further includes:
populating the density data structure with density data obtained from a source density data structure stored on first processor-readable memory that is external to the graphics processing unit; and
populating the results data structure with results data received as a stream of data from a software computation model.

39. The system for generating a physical model for engineering design or visualization of claim 1, wherein densities are a measure of a degree of inclusion within a three dimensional object.

40. The system of claim 1, wherein the value of the density data corresponding to the point on the boundary of the three dimensional volume is selected from the plurality of the pre-determined discretized values based on a degree of inclusion of the point within the three-dimensional volume.

41. The system of claim 40, wherein providing the visualization further comprises:
assigning a background pixel value to the particular pixel if the ray does not intersect any point in the three dimensional volume; and
assigning a pixel value different from the background pixel value if the ray intersects any point in the three dimensional volume.

42. The system of claim 41, wherein all pixels along the ray that intersects any point in the three dimensional volume are assigned a common pixel value.

43. The system of claim 41, wherein pixels along the ray that intersects any point in the three dimensional volume are assigned different pixel values.

44. The system of claim 43, wherein the different pixel values assigned to pixels along the ray that intersects any point in the three dimensional volume are determined based at least on a shading criteria, the shading criteria comprising:
a light pixel value assigned to pixels along the ray that intersects any point in the three dimensional volume if the density data for that pixel does not meet a shading threshold; and
a dark pixel value assigned to pixels along the ray that intersects any point in the three dimensional volume if the density data for that pixel meets the shading threshold.

45. A method of generating a physical model for engineering design or visualization, comprising:
generating a density structure for storing density data at points in a three dimensional volume in a processor-readable memory, wherein the density data corresponds to the points for identifying whether each of the points is within or outside the three dimensional volume;
wherein the density data takes a plurality of discretized values with a pre-determined maximum value and the pre-determined minimum value,
wherein the pre-determined maximum value is larger than the pre-determined minimum value,
a plurality of discretized values between the pre-determined maximum value and the pre-determined minimum value, the points including a first point, a second point and a third point, wherein the first point is within the three dimensional volume, a value of the density data corresponding to the first point is equal to the pre-determined maximum value, wherein the second point is outside the three dimensional volume, a value of the density data corresponding to the second point is equal to the pre-determined minimum value, wherein the third point is on the boundary of the three dimensional volume, a value of the density data corresponding to the third point is equal to one of the plurality of pre-determined discretized values between the pre-determined maximum value and the pre-determined minimum value, generating a results data structure for storing results data in the processor-readable memory, the results data identifying physical values at the points in the three dimensional volume, wherein the results data is distinct from the density data; and performing calculations using the density data and the results data to generate a physical model for providing a visualization utilizing a plurality of data processors operating in parallel, wherein providing the visualization includes:
  for a particular pixel, identifying a first point in the three dimensional volume along a ray originating from a vantage point having a corresponding density data structure density that meets a visualization criterion; and
  determining a pixel value for the particular pixel based on a results data structure value that corresponds with the first identified point in the three dimensional volume.

46. A system for generating a physics simulation model for engineering design or visualization, comprising:
  a processor-readable memory, wherein the processor-readable memory includes:
    a density data structure containing density data corresponding to the points for identifying whether each of the points is within or outside the three dimensional volume,
    wherein the density data takes a plurality of discretized values with a pre-determined maximum value and the pre-determined minimum value,
    wherein the pre-determined maximum value is larger than the pre-determined minimum value,
    a plurality of discretized values between the pre-determined maximum value and the pre-determined minimum value,
    wherein when the point is within the three dimensional volume, the value of the density data corresponding to the point is equal to the pre-determined maximum value,
    wherein when the point is outside the three dimensional volume, the value of the density data corresponding to the point is equal to the pre-determined minimum value,
    wherein when the point is on the boundary of the three dimensional volume, the value of the density data corresponding to the point is equal to one of the plurality of pre-determined discretized values between the pre-determined maximum value and the pre-determined minimum value,
    a results data structure containing results data, wherein the results data is distinct from the density data;
    a volumetric data structure for storing volumetric data, wherein the volumetric data is based on at least the density data and the results data; and
  a plurality of data processors that operate in parallel to perform calculations using the volumetric data to generate a discretized physics model based on visualization algorithms and physics computational algorithms, wherein the visualization algorithm includes:
    for a particular pixel, identifying a first point in the three dimensional volume along a ray originating from a vantage point having a corresponding density data structure density that meets a visualization criterion; and
    determining a pixel value for the particular pixel based on a results data structure value that corresponds with the first identified point in the three dimensional volume.

* * * * *